(12) United States Patent
Son et al.

(10) Patent No.: US 12,428,717 B2
(45) Date of Patent: Sep. 30, 2025

(54) DEPOSITION APPARATUS AND METHOD FOR SEATING MASK OF DEPOSITION APPARATUS

(71) Applicant: Samsung Display Co., Ltd., Yongin-Si (KR)

(72) Inventors: Ji-Hee Son, Hwaseong-si (KR); Youngmin Moon, Yongin-si (KR); Duckjung Lee, Hwaseong-si (KR); Minho Moon, Seongnam-si (KR); Seungyong Song, Suwon-si (KR); Seul Lee, Hwaseong-si (KR); Sungsoon Im, Suwon-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 80 days.

(21) Appl. No.: 17/196,639

(22) Filed: Mar. 9, 2021

(65) Prior Publication Data

US 2022/0081753 A1  Mar. 17, 2022

(30) Foreign Application Priority Data

Sep. 11, 2020  (KR) .................... 10-2020-0117119

(51) Int. Cl.
*C23C 14/04* (2006.01)
*C23C 14/34* (2006.01)
(Continued)

(52) U.S. Cl.
CPC ........ *C23C 14/042* (2013.01); *C23C 14/3485* (2013.01); *C23C 14/50* (2013.01); *H10K 71/166* (2023.02)

(58) Field of Classification Search
CPC .................................................. C23C 14/042
See application file for complete search history.

(56) References Cited

U.S. PATENT DOCUMENTS 3,454,814 A * 7/1969 Mancebo ................ C23C 14/30
313/313
4,676,193 A * 6/1987 Martin .................. C23C 14/042
118/721
(Continued)

FOREIGN PATENT DOCUMENTS

CN  107177818 B  5/2019
JP  2004-183044 A  7/2004
(Continued)

OTHER PUBLICATIONS

Extended European Search Report, Application No. 21196178.4, dated Feb. 1, 2022, 10 pages.

*Primary Examiner* — Keath T Chen
(74) *Attorney, Agent, or Firm* — Innovation Counsel LLP

(57) ABSTRACT

An embodiment provides a deposition apparatus including a mask frame, an opening sheet, a deposition mask, and an electrostatic chuck. In the mask frame, a first opening part is defined. The opening sheet is disposed on the mask frame. In the opening sheet, a second opening part overlapping the first opening part is defined. The deposition mask is disposed on the opening sheet. In the deposition mask, a plurality of third opening parts overlapping the second opening part are defined. The electrostatic chuck is disposed on the deposition mask and on which a substrate is disposed. The substrate is disposed on a surface of the electrostatic chuck, and AC power is applied to the deposition mask.

12 Claims, 16 Drawing Sheets

(51) Int. Cl.
*C23C 14/50* (2006.01)
*H10K 71/16* (2023.01)

(56) References Cited

U.S. PATENT DOCUMENTS

| | | | |
|---|---|---|---|
| 6,214,631 B1* | 4/2001 | Burrows | H10K 71/221 |
| | | | 438/743 |
| 6,475,287 B1* | 11/2002 | Clark | H10K 71/00 |
| | | | 118/721 |
| 7,396,558 B2* | 7/2008 | Fujimori | H10K 71/166 |
| | | | 118/721 |
| 9,530,988 B2 | 12/2016 | Lee et al. | |
| 2001/0019807 A1* | 9/2001 | Yamada | H01L 51/0011 |
| | | | 427/272 |
| 2002/0062785 A1* | 5/2002 | Kim | C23C 14/042 |
| | | | 118/504 |
| 2004/0031442 A1* | 2/2004 | Yamazaki | C23C 14/568 |
| | | | 118/727 |
| 2004/0142108 A1 | 7/2004 | Atobe et al. | |
| 2006/0081968 A1* | 4/2006 | Bai | H01L 23/62 |
| | | | 257/E23.07 |
| 2008/0018236 A1* | 1/2008 | Arai | C23C 14/042 |
| | | | 445/24 |
| 2013/0040047 A1* | 2/2013 | Karaki | C23C 14/042 |
| | | | 118/720 |
| 2016/0186317 A1 | 6/2016 | Han | |
| 2017/0069842 A1 | 3/2017 | Hamamoto et al. | |
| 2017/0141313 A1 | 5/2017 | Min | |
| 2017/0362698 A1* | 12/2017 | Kobayashi | C23C 16/44 |
| 2020/0013658 A1 | 1/2020 | Ko et al. | |
| 2020/0152463 A1* | 5/2020 | Ushikusa | H05B 33/10 |
| 2020/0291510 A1* | 9/2020 | Okamoto | H05B 33/10 |
| 2020/0335472 A1* | 10/2020 | Okamoto | H01L 24/81 |

FOREIGN PATENT DOCUMENTS

| | | | | |
|---|---|---|---|---|
| JP | 6163376 | * | 7/2017 | C23C 14/04 |
| KR | 20040050045 A | | 6/2004 | |
| KR | 10-0550531 B1 | | 2/2006 | |
| KR | 101070539 B1 | | 10/2011 | |
| KR | 10-2016-0116156 A | | 10/2016 | |
| KR | 10-20180047594 A | | 5/2018 | |
| KR | 10-20200006350 A | | 1/2020 | |
| KR | 10-20200048915 A | | 5/2020 | |
| WO | 2015042302 A1 | | 3/2015 | |
| WO | 2018108240 A1 | | 6/2018 | |
| WO | WO 2020032149 | * | 2/2020 | |

* cited by examiner

DEPOSITION APPARATUS AND METHOD FOR SEATING MASK OF DEPOSITION APPARATUS

CROSS-REFERENCE TO RELATED APPLICATIONS

This U.S. non-provisional patent application claims priority under 35 U.S.C. § 119 of Korean Patent Application No. 10-2020-0117119, filed on Sep. 11, 2020, the entire contents of which are hereby incorporated by reference.

BACKGROUND

The present disclosure herein relates to a deposition apparatus and a mask seating method of the deposition apparatus.

In general, an organic light emitting diode (OLED) display device has excellent luminance characteristics and viewing angle characteristics and is attracting attention as a next-generation flat panel display. The OLED display device does not require a separate light source, which is required for liquid crystal displays. Since the OLED display device does not require a separate light source, it may be manufactured in a lightweight and thin form. In addition, the OLED display device has characteristics such as low power consumption, high luminance, and high reaction speed.

The OLED display device includes a plurality of light emitting elements each including an anode, a light emitting layer, and a cathode. Holes and electrons are injected from the anode and the cathode into the light emitting layer, respectively, to form excitons. When the excitons transition to the ground state, the light emitting elements emit light. During manufacturing of the light emitting elements, a mask is placed on a substrate, and an organic material for forming the light emitting layers through the opening parts of the mask is provided on the substrate.

SUMMARY

The present disclosure provides a deposition apparatus capable of easily seating a deposition mask on a substrate, and a mask seating method of the deposition apparatus.

An embodiment of the inventive concept provides a deposition apparatus including a mask frame, an opening sheet, a deposition mask, and an electrostatic chuck. In the mask frame, a first opening part is defined. The opening sheet is disposed on the mask frame. In the opening sheet, a second opening part overlapping the first opening part is defined. The deposition mask is disposed on the opening sheet. In the deposition mask, a plurality of third opening parts overlapping the second opening part are defined. The electrostatic chuck is disposed on the deposition mask and on which a substrate is disposed. The substrate is disposed on a surface of the electrostatic chuck, and AC power is applied to the deposition mask.

In an embodiment of the inventive concept, a deposition apparatus includes a mask frame, an opening sheet, a deposition mask, and an electrostatic chuck. In the mask frame, a first opening part is defined. The opening sheet is disposed on the mask frame. In the opening sheet, a second opening part overlapping the first opening part is defined. The deposition mask is disposed on the opening sheet. In the deposition mask, a plurality of third opening parts overlapping the second opening part are defined. The electrostatic chuck is disposed on the deposition mask and on which a substrate is disposed. The substrate is disposed on a surface of the electrostatic chuck. The deposition mask includes a polymer mask, and a conductive layer disposed on a surface of the polymer mask. The substrate and the conductive layer are charged with different polarities.

In an embodiment of the inventive concept, a mask seating method of a deposition apparatus includes disposing an opening sheet, in which a second opening part overlapping a first opening part is defined, on a mask frame in which the first opening part is defined. A deposition mask is disposed in which a plurality of third opening parts overlapping the second opening part are defined on the opening sheet. An electrostatic chuck is disposed on the deposition mask. An electrostatic force is generated in the electrostatic chuck to dispose a substrate on a surface of the electrostatic chuck. The substrate is grounded and AC power is applied to the deposition mask to dispose the deposition mask to be close to the substrate.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept.

DETAILED DESCRIPTION

Figure 1:
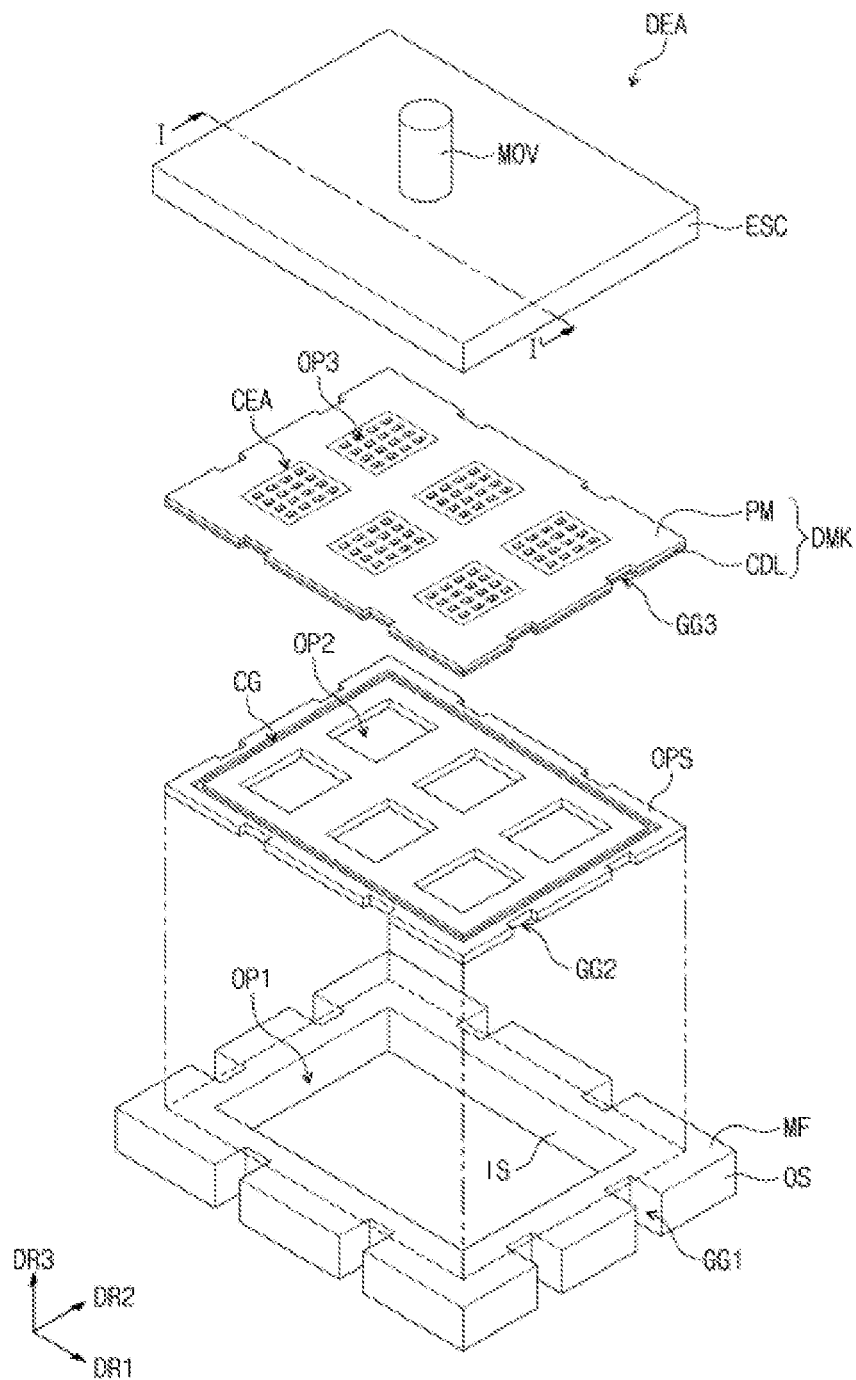
FIG. 1 is a perspective view of a deposition apparatus according to an embodiment of the inventive concept.

In this specification, when an element or region, layer, part, etc. is referred to as being "on", "connected to", or "coupled to" another element, it means that it may be directly placed on/connected to/coupled to other components, or a third component may be arranged between them.

Like reference numerals refer to like elements. Additionally, in the drawings, the thicknesses, proportions, and dimensions of components are exaggerated for effective description.

"And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the inventive concept. The terms of a singular form may include plural forms unless otherwise specified.

In addition, terms such as "below", "the lower side", "on", and "the upper side" are used to describe a relationship of configurations shown in the drawing. The terms are described as a relative concept based on a direction shown in the drawing and not necessarily based on a gravitational reference.

Unless otherwise defined, all terms, including technical and scientific terms, used herein have the same meaning as commonly understood by one of ordinary skill in the art to which this inventive concept belongs. In addition, terms defined in a commonly used dictionary should be interpreted as having a meaning consistent with the meaning in the context of the related technology, and unless interpreted in an ideal or overly formal sense, the terms are explicitly defined herein.

In various embodiments of the inventive concept, the term "include," "comprise," "including," or "comprising," specifies a property, a region, a fixed number, a step, a process, an element and/or a component but does not exclude other properties, regions, fixed numbers, steps, processes, elements and/or components.

Hereinafter, embodiments of the inventive concept will be described in detail with reference to the drawings.

FIG. 1 is a perspective view of a deposition apparatus DEA according to an embodiment of the inventive concept.

Referring to FIG. 1, a deposition apparatus DEA according to an embodiment of the inventive concept may include a mask frame MF, an opening sheet OPS, a deposition mask DMK, an electrostatic chuck ESC, and a transfer unit MOV.

The mask frame MF may have a quadrangular shape having side surfaces extending in a first direction DR1 and side surfaces extending in a second direction DR2 crossing the first direction DR1. The mask frame MF may have a rectangular frame shape, but the shape of the mask frame MF can be shapes other than rectangular.

A first opening part OP1 may be defined in the mask frame MF. The first opening part OP1 may have a rectangular shape, but the shape of the first opening part OP1 can be shapes other than rectangular.

The mask frame MF may include a metal material. For example, the mask frame MF may include Invar or stainless steel.

Hereinafter, a direction crossing a plane defined by the first and second directions DR1 and DR2 is defined as a third direction DR3. The third direction DR3 may substantially perpendicularly intersect a plane defined by the first and second directions DR1 and DR2. In this specification, the meaning of "when viewed on a plane" may mean a state viewed from the third direction DR3.

A plurality of first guide grooves GG1 may be defined on an edge of the mask frame MF. An outer surface OS of the mask frame MF opposite to an inner surface IS of the mask frame MF defines the first opening part OP1. The outer surface OS may be defined as an edge of the mask frame MF. The first guide grooves GG1 may be defined on the outer surface OS of the mask frame MF.

The first guide grooves GG1 may be formed by being recessed by a predetermined depth from the outer surface OS of the mask frame MF toward the inner surface IS of the mask frame MF. The first guide grooves GG1 may extend in the third direction DR3.

The opening sheet OPS may be disposed on the mask frame MF. The opening sheet OPS may have a plane defined by the first and second directions DR1 and DR2. The opening sheet OPS may have a quadrangular shape having side surfaces extending in the first direction DR1 and side surfaces extending in the second direction DR2, but the shape of the opening sheet OPS can be shapes other than a quadrangular shape.

A plurality of second opening parts OP2 may be defined in the opening sheet OPS. The second opening parts OP2 may be arranged in the first direction DR1 and the second direction DR2. The second opening parts OP2 may overlap the first opening part OP1 when viewed on a plane. The second opening parts OP2 may have a rectangular shape, but the shape of the second opening parts OP2 can be shapes other than rectangular.

A connection groove CG may be defined on an upper surface of the opening sheet OPS adjacent to the edge of the opening sheet OPS. The connection groove CG may be formed by being recessed by a predetermined depth from the upper surface of the opening sheet OPS toward the lower surface of the opening sheet OPS.

The connection groove CG may extend along the edge of the opening sheet OPS. The connection groove CG may have a rectangular single closed curve shape, but the shape of the connection groove CG can be shapes other than a rectangular single closed curve shape. The function of the connection groove CG will be described in detail below. The second opening parts OP2 may be disposed in an area defined by the connection groove CG.

A plurality of second guide grooves GG2 may be defined at the edge of the opening sheet OPS. The edge of the opening sheet OPS may be defined as side surfaces defining a square shape of the opening sheet OPS. The second guide grooves GG2 may be formed by being recessed by a predetermined depth toward the connection groove CG at the edge of the opening sheet OPS. When viewed on a plane, the second guide grooves GG2 may overlap the first guide grooves GG1.

The opening sheet OPS may have a thickness smaller than that of the mask frame MF based on the third direction DR3. For example, the opening sheet OPS may have a thickness of 10 μm to 150 μm. The opening sheet OPS may include a metallic material. For example, the opening sheet OPS may include Invar or stainless steel.

The deposition mask DMK may be disposed on the opening sheet OPS. The deposition mask DMK may be supported by the opening sheet OPS. The deposition mask DMK may have a plane defined by the first and second directions DR1 and DR2. The deposition mask DMK may have a quadrangular shape having side surfaces extending in the first direction DR1 and side surfaces extending in the second direction DR2, but the shape of the deposition mask DMK can be shapes other than a quadrangular shape.

A plurality of cell regions CEA may be defined in the deposition mask DMK. The cell areas CEA may be arranged in a first direction DR1 and a second direction DR2. The cell areas CEA may overlap the second opening parts OP2 when viewed on a plane. The cell areas CEA may have a shape corresponding to the second opening parts OP2. For example, the cell areas CEA may have a rectangular shape.

A plurality of third opening parts OP3 may be defined in each of the cell areas CEA. The third opening parts OP3 may be arranged in a first direction DR1 and a second direction DR2. The third opening parts OP3 may overlap the second opening parts OP2 when viewed on a plane. For example, the third opening parts OP3 may have a rectangular shape, but the shape of the third opening parts OP3 can be shapes other than a rectangular shape.

A plurality of third guide grooves GG3 may be defined at an edge of the deposition mask DMK. The edge of the deposition mask DMK may be defined as sides defining the square shape of the deposition mask DMK. The third guide grooves GG3 may be formed by being recessed by a predetermined depth from the edge of the deposition mask DMK toward the inside of the deposition mask DMK. When viewed on a plane, the third guide grooves GG3 may overlap the second guide grooves GG2.

The deposition mask DMK may include a polymer mask PM and a conductive layer CDL disposed under the polymer mask PM. The polymer mask PM and the conductive layer CDL may have a plane defined by the first and second directions DR1 and DR2. The polymer mask PM and the conductive layer CDL may have a quadrangular shape having side surfaces extending in a first direction DR1 and side surfaces extending in a second direction DR2.

The polymer mask PM may include a plastic material. For example, the polymer mask PM may include a polymer film. The polymer mask PM may include a polymer material such as polyimide (PI), polycarbonate (PC), or polyethylene terephthalate (PET). For example, based on the third direction DR3, the polymer mask PM may have a thickness of 5 μm to 15 μm.

The price of a polymer mask PM may be cheaper than that of a metal mask formed of metal. In addition, the polymer mask PM may have lower corrosion resistance and higher corrosion resistance than a metal mask.

The conductive layer CDL may be disposed on the lower surface of the polymer mask PM. The conductive layer CDL may be disposed to contact the lower surface of the polymer mask PM. The conductive layer CDL may include a metallic material. For example, the conductive layer CDL may include titanium (Ti), but the metal material of the conductive layer CDL can include metallic materials other than titanium. Based on the third direction DR3, the conductive layer CDL may have a thickness of 500 Å to 1500 Å.

The above-mentioned third opening parts OP3 may be defined in the polymer mask PM and the conductive layer CDL. The above-described third guide grooves GG3 may be defined in the polymer mask PM and the conductive layer CDL.

The electrostatic chuck ESC may be disposed on the deposition mask DMK. The electrostatic chuck ESC may have a plane defined by the first and second directions DR1 and DR2. The electrostatic chuck ESC may have a quadrangular shape having side surfaces extending in the first direction DR1 and side surfaces extending in the second direction DR2, but the shape of the electrostatic chuck ESC can be shapes other than a quadrangular shape. The electrostatic chuck ESC may generate electrostatic power, sometimes called electrostatic force.

The transfer unit MOV may be disposed on an electrostatic chuck ESC. The transfer unit MOV may have a cylindrical shape extending in the third direction DR3. The transfer unit MOV may be connected to the upper part of the electrostatic chuck ESC. The transfer unit MOV may move in the third direction DR3 to transfer the electrostatic chuck ESC in the third direction DR3.

Figure 2:
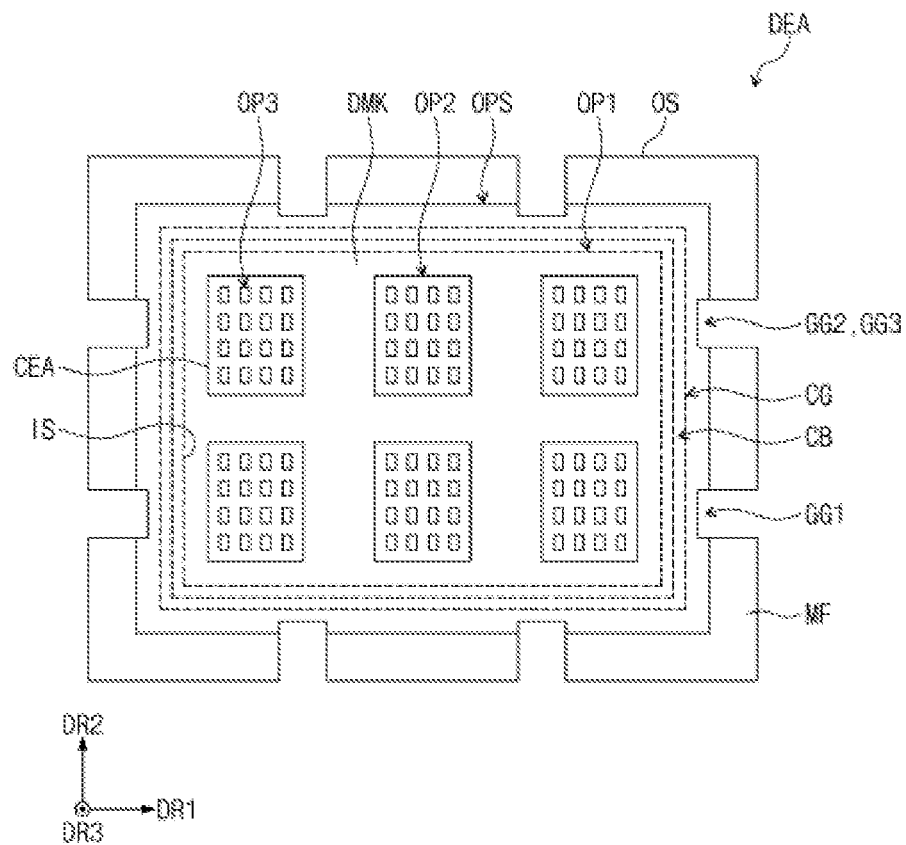
FIG. 2 is a plan view of a mask frame, an opening sheet, and a deposition mask as viewed above the mask frame, the opening sheet, and the deposition mask shown in FIG. 1.

FIG. 2 is a plan view of the mask frame MF, the opening sheet OPS, and the deposition mask DMK as viewed above the mask frame MF, the opening sheet OPS, and the deposition mask DMK shown in FIG. 1.

Referring to FIG. 2, when viewed on a plane, the edge of the opening sheet OPS may be disposed between the outer surface OS of the mask frame MF and the inner surface IS of the mask frame MF. When viewed on a plane, the second opening parts OP2 defined in the opening sheet OPS may overlap the first opening part OP1. When viewed on a plane, the connection groove CG defined in the opening sheet OPS may be disposed between the inner surface IS of the mask frame MF and the edge of the opening sheet OPS.

When viewed on a plane, the edge of the deposition mask DMK may be disposed between the outer surface OS of the mask frame MF and the inner surface IS of the mask frame MF. When viewed on a plane, the cell areas CEA defined in the deposition mask DMK may overlap the first opening part OP1.

When viewed on a plane, the cell areas CEA may overlap the second opening parts OP2, respectively. The third opening parts OP3 respectively defined in the cell areas CEA may overlap the corresponding second opening parts OP2 among the second opening parts OP2 when viewed on a plane.

When viewed on a plane, the first guide grooves GG1, the second guide grooves GG2, and the third guide grooves GG3 may overlap each other.

The deposition apparatus DEA may include a plurality of connection bars CB disposed to overlap the connection groove CG. The connection bars CB may be disposed on the deposition mask DMK and may be adjacent to the edge of the deposition mask DMK. The connection bars CB may be disposed along the edge of the deposition mask DMK.

The connection bars CB may include connection bars CB extending in the first direction DR1 and connection bars CB extending in the second direction DR2. Ends of the connection bars CB may be disposed adjacent to each other or may be disposed to contact each other. The connection bars CB may include a metallic material. For example, the connection bars CB may include Invar or stainless steel.

Figure 3:
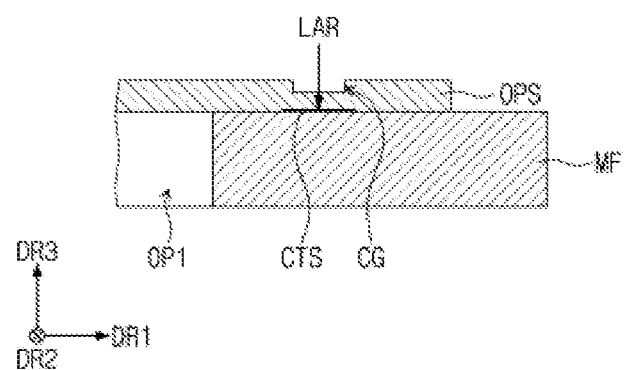
FIG. 3 is a diagram illustrating a method of connecting an opening sheet to the mask frame illustrated in FIG. 1.

FIG. 3 is a diagram illustrating a method of connecting the opening sheet OPS to the mask frame MF illustrated in FIG. 1.

For example, in FIG. 3, a cross section of a portion of the mask frame MF and a portion of the opening sheet OPS viewed from the first direction DR1 is illustrated.

Referring to FIG. 3, the opening sheet OPS may be disposed on the mask frame MF. The lower surface of the opening sheet OPS may contact the upper surface of the mask frame MF.

The opening sheet OPS may be connected to the mask frame MF by laser welding. For example, a laser LAR may be provided on a contact surface CTS between the opening sheet OPS and the mask frame MF. The contact surface CTS between the opening sheet OPS and the mask frame MF is melted by the laser LAR, so that the opening sheet OPS may be connected to the mask frame MF.

Figure 4A:
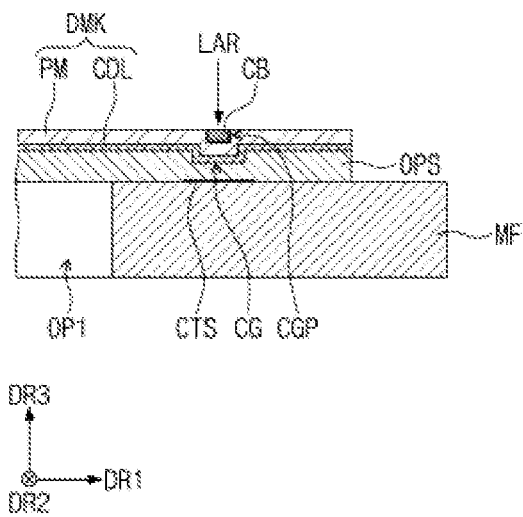
FIGS. 4A and 4B are diagrams for explaining a method of connecting a deposition mask to the opening sheet shown in FIG. 1.
Figure 4B:
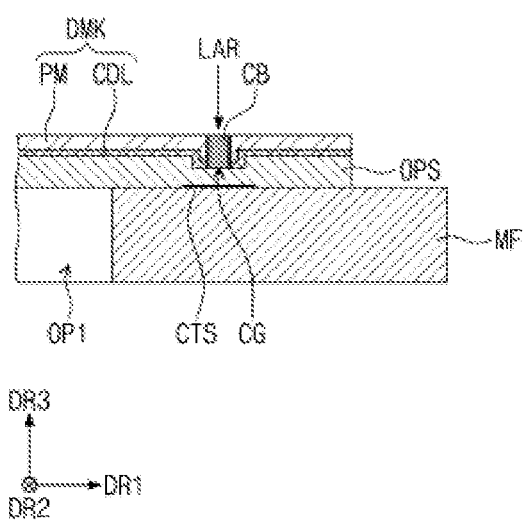

FIGS. 4A and 4B are diagrams for explaining a method of connecting the deposition mask DMK to the opening sheet OPS shown in FIG. 1.

For example, a cross section of a portion of the mask frame MF viewed from the first direction DR1, a portion of the opening sheet OPS, and a portion of the deposition mask DMK is illustrated in FIGS. 4A and 4B.

Referring to FIG. 4A, the connection bar CB may be disposed on the deposition mask DMK. The connection bar CB may be disposed to overlap the connection groove CG. The portion of the deposition mask DMK overlapping the connection groove CG and the connection bar CB may be recessed toward the connection groove CG.

A portion of the deposition mask DMK overlapping the connection groove CG may be recessed in the connection groove CG. The connection bar CB may be disposed at a recess part CGP of the deposition mask DMK recessed by the connection groove CG.

If the connection groove CG is not defined in the opening sheet OPS, a deposition mask DMK is disposed on a flat opening sheet OPS, and a connection bar CB may be disposed on a flat deposition mask DMK. Accordingly, the connection bar CB may protrude higher than the deposition mask DMK. In this case, when the substrate to be described below is disposed adjacent to the upper surface of the deposition mask DMK, the substrate may be damaged by contacting the connection bar CB.

In an embodiment of the inventive concept, the connection bar CB may be disposed in the recess part CGP of the deposition mask DMK. Accordingly, the connection bar CB may be disposed at least at the same height as the upper surface of the deposition mask DMK or lower than the upper surface of the deposition mask DMK. Since the connection bar CB does not protrude higher than the deposition mask DMK, the substrate may not contact the connection bar CB.

Referring to FIG. 4B, the deposition mask DMK may be connected to the opening sheet OPS through the connection bar CB. For example, the laser LAR may be provided on the deposition mask DMK and the opening sheet OPS overlapping the connection groove CG. The connection bar CB, the deposition mask DMK, and the opening sheet OPS are melted by the laser LAR, so that the connection bar CB may be connected to the conductive layer CDL of the deposition mask DMK and the opening sheet OPS.

Figure 5:
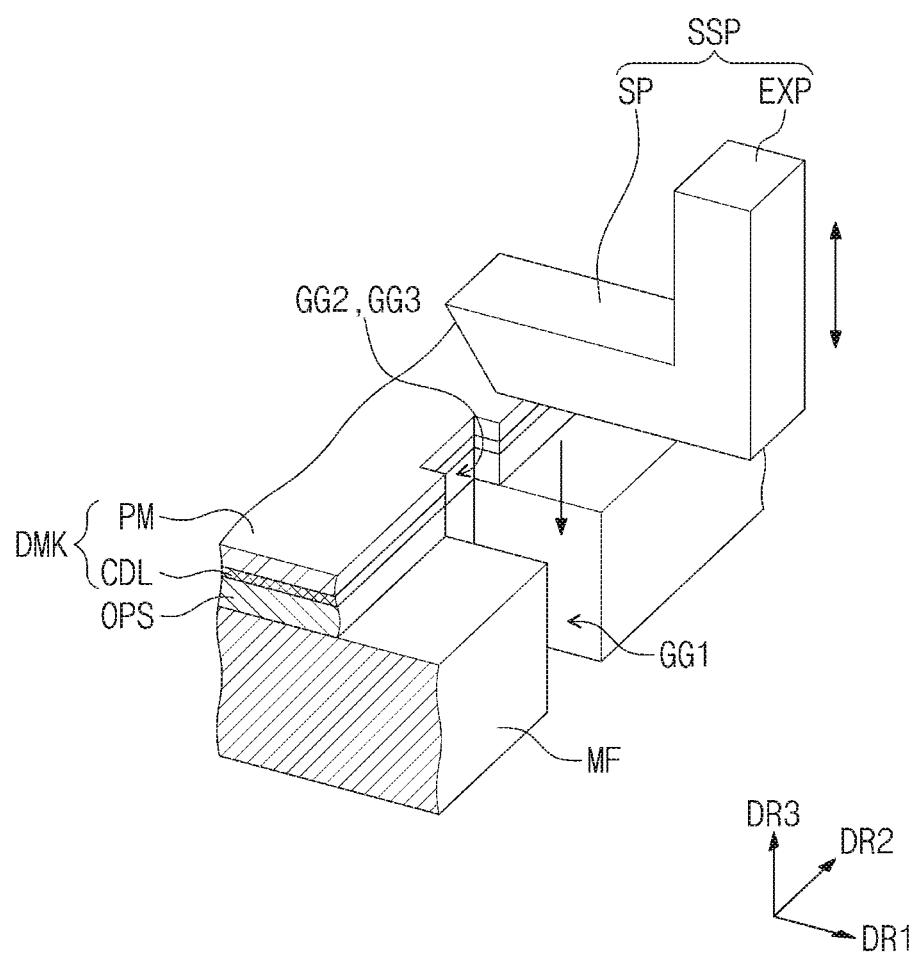
FIG. 5 is a diagram illustrating a substrate support part moving along first, second, and third guide grooves shown in FIG. 1.

FIG. 5 is a diagram illustrating a substrate support part SSP moving along the first, second, and third guide grooves GG1, GG2, and GG3 shown in FIG. 1.

For example, FIG. 5 illustrates a portion of the mask frame MF in which the first, second, and third guide grooves GG1, GG2, and GG3 are defined, a portion of the opening sheet OPS, and a portion of the deposition mask DMK.

Referring to FIG. 5, the deposition apparatus DEA may further include the substrate support part SSP. A plurality of substrate support parts SSP may be provided to support the substrate, and this configuration will be shown in FIG. 6 below. The substrate support part SSP may move in the third direction DR3. The substrate support part SSP may reciprocate in an upper direction and a lower direction, e.g., up and down in the third direction DR3.

When the substrate support part SSP moves in the third direction DR3, it may move along the first, second, and third guide grooves GG1, GG2, and GG3. Accordingly, the substrate support part SSP may not contact the mask frame MF, the opening sheet OPS, and the deposition mask DMK when moving in the third direction DR3.

The substrate support part SSP may include a support part SP for supporting the substrate and an extension part EXP extending in the third direction DR3 from the support part SP. Substantially, the support part SP may move along the first, second, and third guide grooves GG1, GG2, and GG3.

Figure 6:
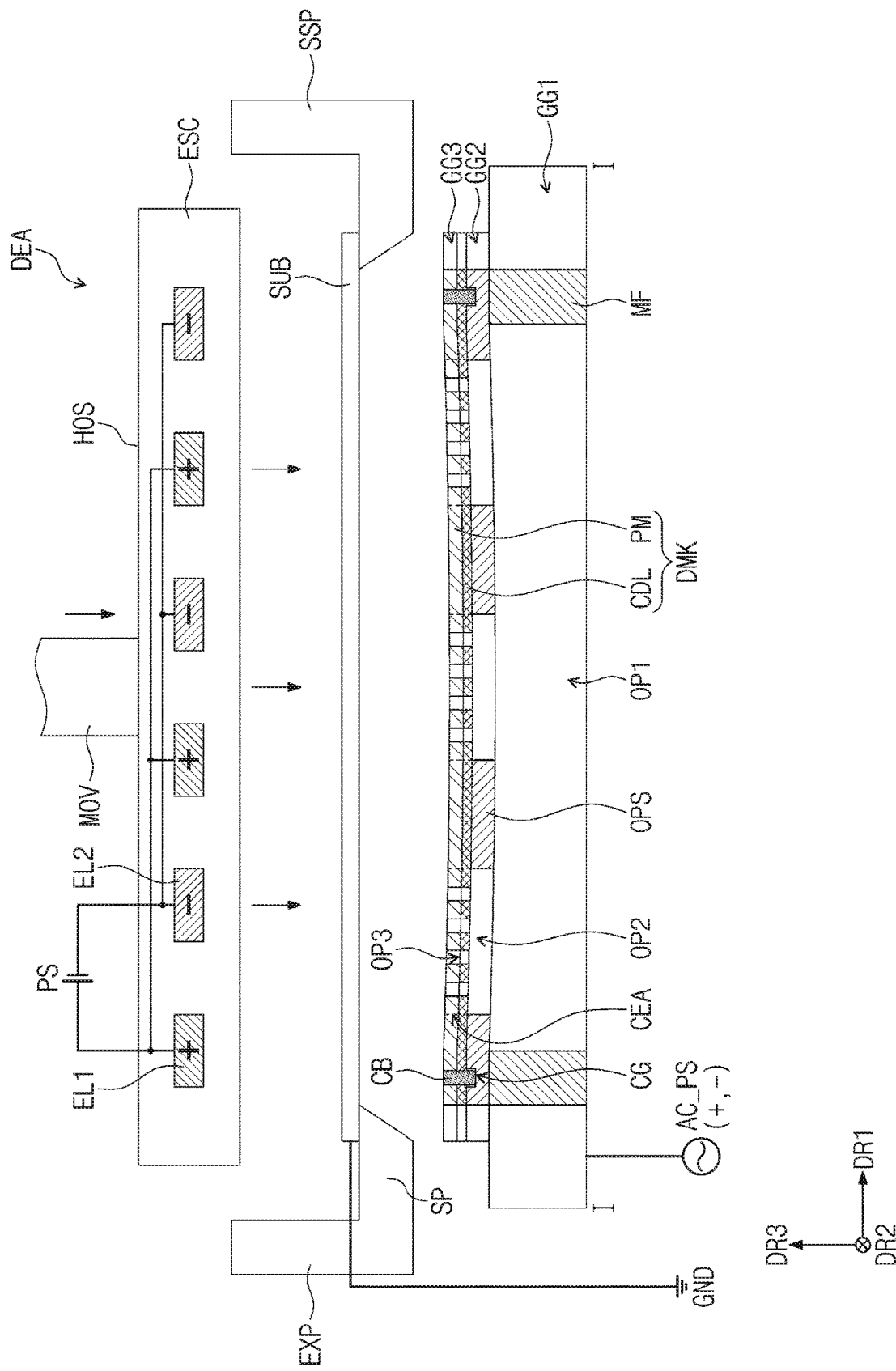
FIG. 6 is a cross-sectional view taken along line I-I' shown in FIG. 1.

FIG. 6 is a cross-sectional view taken along line I-I' shown in FIG. 1.

Hereinafter, referring to FIGS. 6, 7, 8, and 9, a method in which a deposition mask DMK is seated on a substrate SUB will be described.

Referring to FIG. 6, an opening sheet OPS may be disposed on a mask frame MF, a deposition mask DMK may be disposed on the opening sheet OPS, and a substrate SUB may be disposed on the deposition mask DMK. An electrostatic chuck ESC may be disposed on the substrate SUB. The substrate SUB may have a plane defined by the first and second directions DR1 and DR2.

A plurality of substrate support parts SSP may support the substrate SUB. For example, the substrate SUB may be disposed on the support parts SP of the substrate support parts SSP. The support parts SP may be disposed under a portion of the substrate SUB adjacent to the edge of the substrate SUB to support the substrate SUB. The substrate SUB supported by the substrate support parts SSP may be disposed between the electrostatic chuck ESC and the deposition mask DMK.

When viewed on a plane, the substrate support parts SSP may be disposed to overlap the first, second, and third guide grooves GG1, GG2, and GG3. For example, the substrate support parts SSP may be disposed to overlap the first, second, and third guide grooves GG1, GG2, and GG3 shown in FIG. 1. Accordingly, the substrate support parts SSP may be disposed along the edge of the electrostatic chuck ESC, the edge of the opening sheet OPS, and the edge of the deposition mask DMK.

The support parts SP may extend in a direction parallel to the plane of the substrate SUB. Referring to FIGS. 1 and 6, the support parts SP disposed in the first, second, and third guide grooves GG1, GG2, and GG3 defined on both sides of the electrostatic chuck ESC, the opening sheet OPS, and the deposition mask DMK opposite to each other in the first direction DR1 may extend in the first direction DR1.

Although not shown in the drawing, the support parts SP disposed in the first, second, and third guide grooves GG1, GG2, and GG3 defined on both sides of the electrostatic chuck ESC, the opening sheet OPS, and the deposition mask DMK opposite each other in the second direction DR2 may extend in the second direction DR2.

The electrostatic chuck ESC may include a housing HOS, a plurality of first electrodes EL1 disposed in the housing HOS, and a plurality of second electrodes EL2 disposed in the housing HOS. The first electrodes EL1 and the second electrodes EL2 may be alternately disposed in the first direction DR2. Although not shown in the drawing, the first electrodes EL1 and the second electrodes EL2 may also be alternately disposed in the second direction DR2.

The first electrodes EL1 may have a first polarity. The second electrodes EL2 may have a second polarity opposite to the first polarity. For example, the first polarity may have a positive polarity (+), and the second polarity may have a negative polarity (−). However, in an embodiment, the first polarity may have a negative polarity (−), and the second polarity may have a positive polarity (+).

The electrostatic chuck ESC may be connected to a power source PS. The power source PS may be connected to the first electrodes EL1 and the second electrodes EL2. The power source PS may include one terminal defined as an anode and the other terminal defined as a cathode. One terminal of the power source PS is connected to the first electrodes EL1 so that the first electrodes EL1 may have a positive polarity. The other terminal of the power source PS is connected to the second electrodes EL2 so that the second electrodes EL2 may have a negative polarity.

As the power source PS is applied to the electrostatic chuck ESC, electrostatic power (electrostatic force) may be generated in the electrostatic chuck ESC. For example, as the power source PS is applied to the first and second electrodes EL1 and EL2, electrostatic power (electrostatic force) may be generated.

The electrostatic chuck ESC may be transferred in the third direction DR3 by the transfer unit MOV. The electrostatic chuck ESC may move toward the substrate SUB.

The opening sheet OPS disposed on the mask frame MF may contact the upper surface of the mask frame MF. The deposition mask DMK disposed on the opening sheet OPS may contact the upper surface of the opening sheet OPS. The conductive layer CDL of the deposition mask DMK may contact the upper surface of the opening sheet OPS.

AC power AC_PS may be applied to the deposition mask DMK. AC power AC_PS may be applied to the conductive layer CDL of the deposition mask DMK. As the positive and negative voltages (+, −) of the AC power supply AC_PS are swapped, they may be applied to the deposition mask DMK.

The AC power AC_PS may be connected to the mask frame MF. The AC power AC_PS may be applied to the conductive layer CDL through the mask frame MF and the opening sheet OPS in contact with each other.

The substrate SUB may be grounded. For example, the substrate SUB may include a metal layer, and a ground terminal GND may be connected to the metal layer. Specifically, the metal layer of the substrate SUB may include wires and pads connected to the wires. The pads are connected to the ground terminal GND so that the substrate SUB may be grounded. Pads and wires will be shown in FIG. 11 below.

Figure 7:
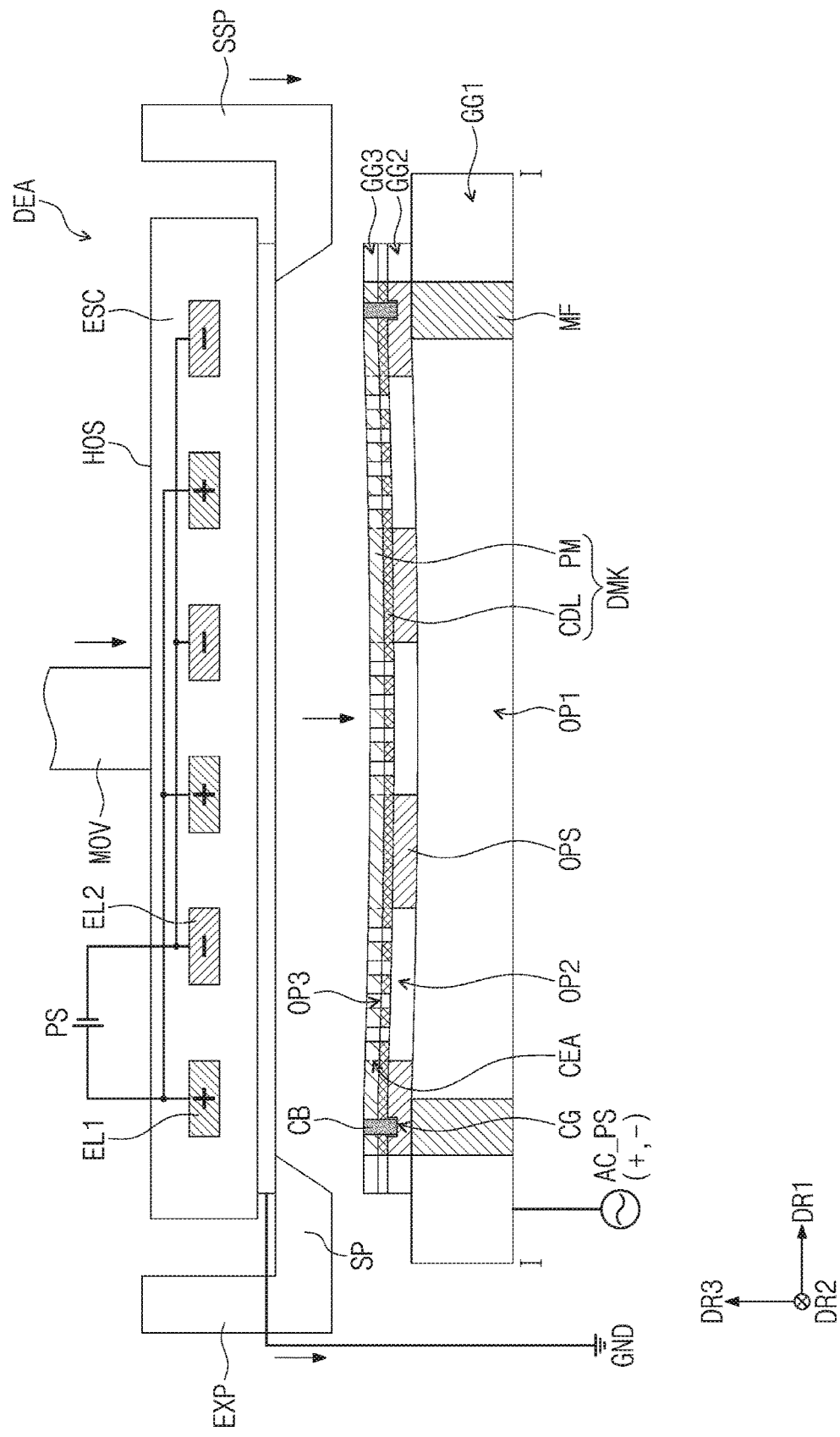
FIG. 7 is a view showing a state in which the substrate is in contact with the lower surface of the electrostatic chuck shown in FIG. 6.

FIG. 7 is a view showing a state in which the substrate SUB is in contact with the lower surface of the electrostatic chuck ESC shown in FIG. 6.

Referring to FIG. 7, the electrostatic chuck ESC may move toward the substrate SUB in the third direction DR3 to be adjacent to the substrate SUB. The electrostatic chuck ESC may generate electrostatic power, and an attractive force may be generated between the substrate SUB and the electrostatic chuck ESC by the electrostatic power. In other words, the electrostatic chuck ESC may generate static electricity and thus an attractive electrostatic force may be generated between the substrate SUB and the electrostatic chuck ESC. Accordingly, the substrate SUB may be in close contact with the lower surface of the electrostatic chuck ESC and may contact the lower surface of the electrostatic chuck ESC.

When performing the deposition process, the substrate SUB should be fixed. The substrate SUB may be fixed to the electrostatic chuck ESC by contacting the lower surface of the electrostatic chuck ESC by electrostatic power generated from the electrostatic chuck ESC.

Illustratively, the substrate SUB is shown flat in FIG. 6, but substantially, when the substrate support part SSP supports the edge of the substrate SUB, the substrate SUB may lowered by gravity. Since the substrate SUB is in contact with the lower surface of the electrostatic chuck ESC by the electrostatic chuck ESC, the substrate SUB may be spread flat without being lowered.

Although not shown in the drawing, the transfer unit MOV may rotate based on a rotation axis parallel to the third direction DR3 to rotate the electrostatic chuck ESC. The electrostatic chuck ESC rotates so that the substrate SUB may be aligned to normally overlap the deposition mask DMK.

Figure 8:
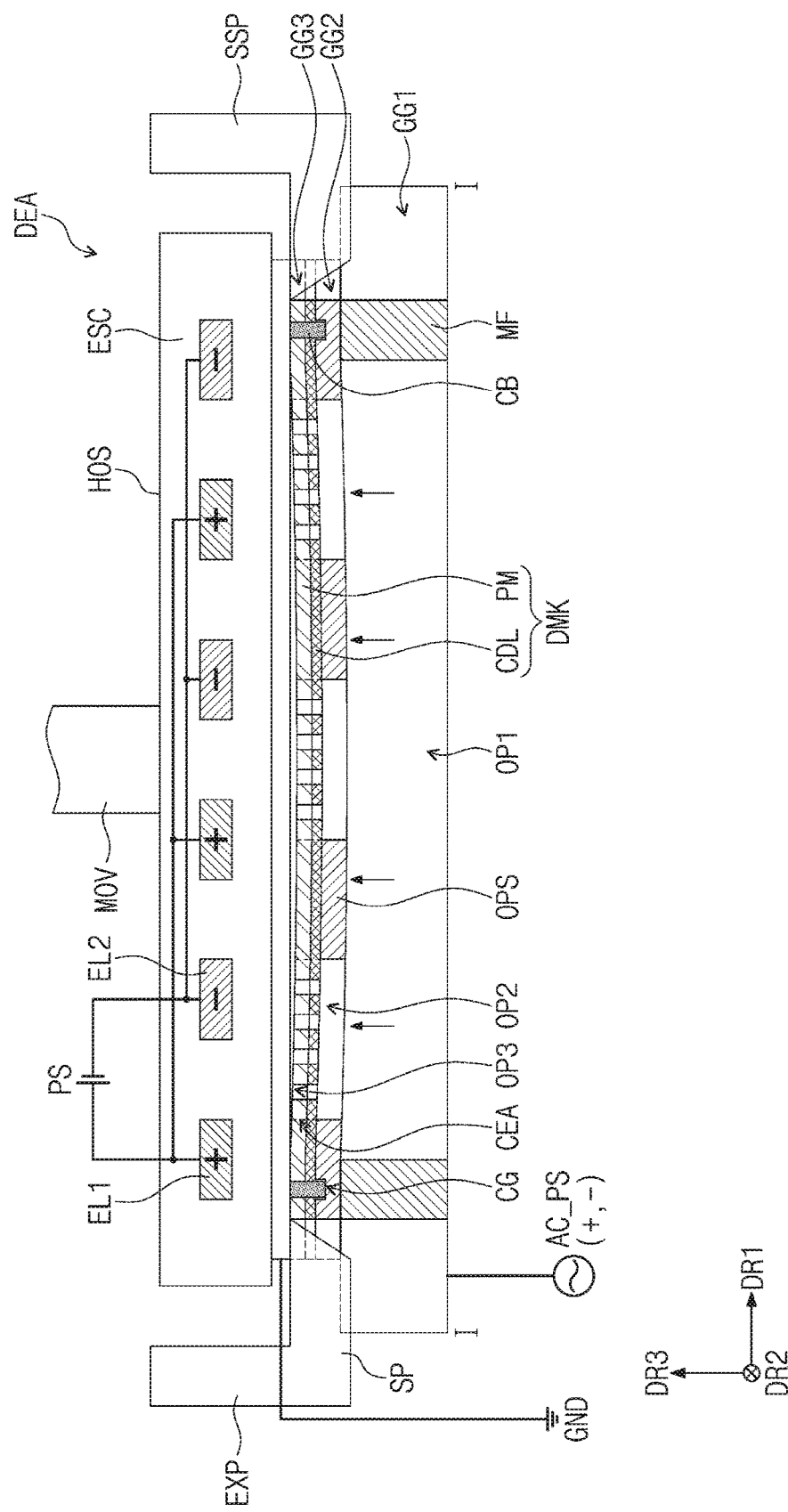
FIG. 8 is a diagram illustrating a state in which the substrate shown in FIG. 7 moves downward and is disposed on the deposition mask.
Figure 9:
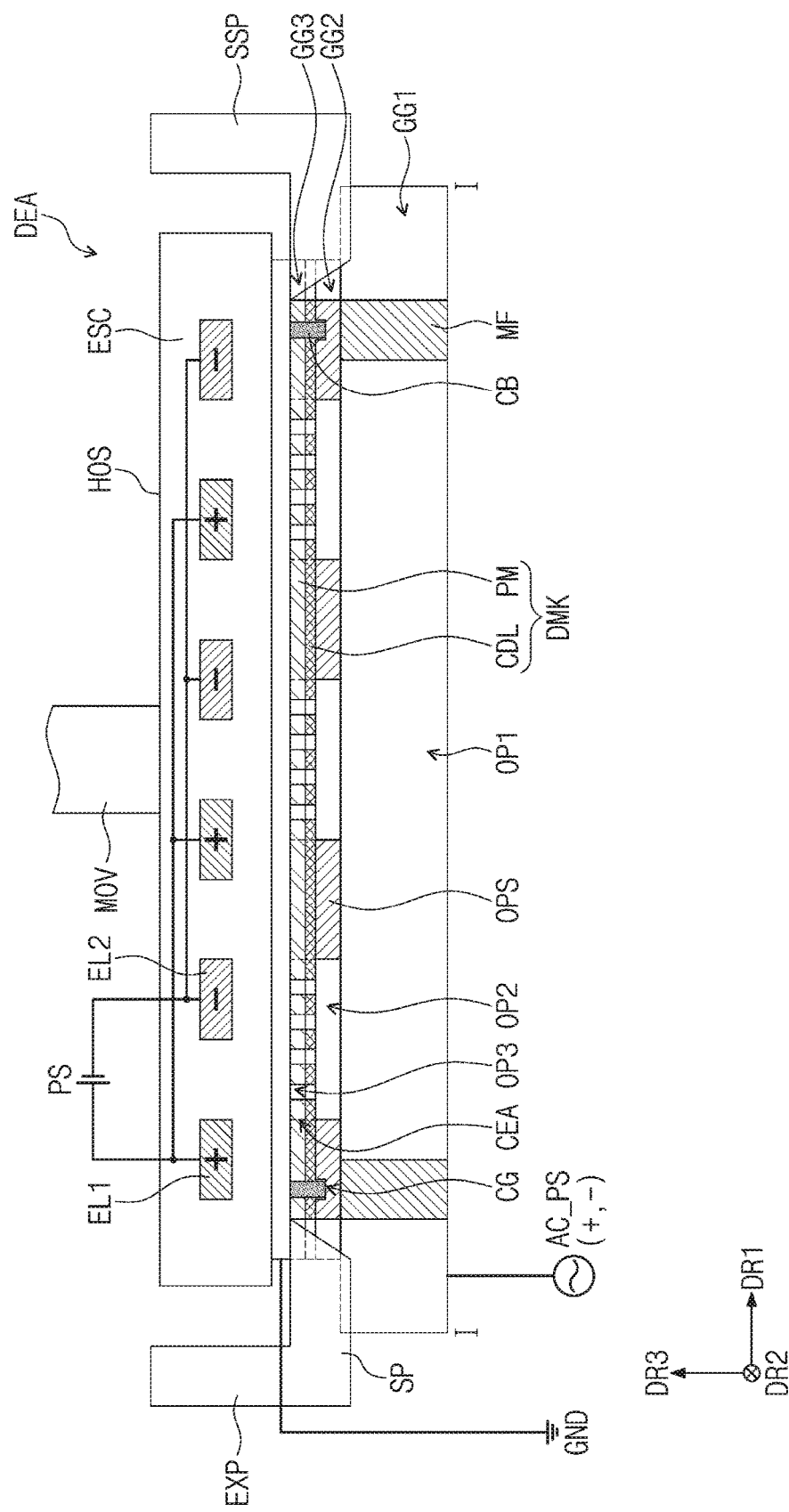
FIG. 9 is a diagram illustrating a state in which the deposition mask shown in FIG. 8 is disposed close to a substrate.

FIG. 8 is a diagram illustrating a state in which the substrate SUB shown in FIG. 7 moves downward and is disposed on the deposition mask. FIG. 9 is a diagram illustrating a state in which the deposition mask shown in FIG. 8 is disposed close to a substrate.

Referring to FIG. 8, the electrostatic chuck ESC may be moved toward the deposition mask DMK by the transfer unit MOV. In addition, the substrate SUB may move in the third direction DR3 by the substrate support parts SSP and may move toward the deposition mask DMK.

The substrate support parts SSP may move along the first, second, and third guide grooves GG1, GG2, and GG3. The substrate support parts SSP may be disposed in the first, second, and third guide grooves GG1, GG2, and GG3 so that the substrate SUB is disposed adjacent to the deposition mask DMK. For example, support parts SP may be disposed in the first, second, and third guide grooves GG1, GG2, and GG3 so that the substrate SUB is disposed adjacent to the deposition mask DMK.

The electrostatic power generated by the electrostatic chuck ESC may be blocked by the metal layer of the substrate SUB and may not be transmitted to the deposition mask DMK. Therefore, a means for pulling the deposition mask DMK to the substrate SUB is required.

In an embodiment of the inventive concept, since the substrate SUB is grounded and the positive and negative voltages (+, −) are swapped and applied to the conductive layer CDL, electrostatic power may be generated between the substrate SUB and the conductive layer CDL. That is, the substrate SUB is grounded, and the positive and negative voltages (+, −) are swapped and applied to the conductive layer CDL, so that an attractive force may be generated between the substrate SUB and the conductive layer CDL.

The deposition mask DMK and the opening sheet OPS may be lowered by gravity. The deposition mask DMK and the opening sheet OPS may move toward the substrate SUB by the attraction generated between the substrate SUB and the conductive layer CDL.

Referring to FIGS. 8 and 9, the conductive layer CDL of the deposition mask DMK may move toward the substrate SUB by the attraction generated between the substrate SUB and the conductive layer CDL. As the conductive layer CDL moves toward the substrate SUB, the polymer mask PM disposed on the conductive layer CDL may also move toward the substrate SUB.

The deposition mask DMK may move toward the substrate SUB, so that the deposition mask DMK may be disposed close to the substrate SUB. Accordingly, the interval between the deposition mask DMK and the substrate SUB may be minimized. The state of the deposition mask DMK may be defined as a state in which the deposition mask DMK is seated on the substrate SUB.

The deposition mask DMK may be disposed close to the substrate SUB or may contact the substrate SUB. The polymer mask PM may be disposed close to the substrate SUB or may contact the substrate SUB. The lowered deposition mask DMK may move upward toward the substrate SUB to be spread more flatly. More particularly, due to the attractive force between the lowered deposition mask DMK and the substrate SUB, the lowered deposition mask DMK may be flattened as shown in FIG. 9 to reduce or eliminate any space (see FIG. 8) between the lowered deposition mask DMK and the substrate SUB.

When performing the deposition process, the deposition mask DMK must be disposed close to the substrate SUB so that the deposition material may be normally provided in the deposition area. This deposition process will be described below with reference to FIGS. 13A and 13B.

In an embodiment of the inventive concept, by disposing the conductive layer CDL under the polymer mask PM, the polymer mask PM may be disposed close to the substrate SUB by the conductive layer CDL. Therefore, the deposition process may be normally performed.

The AC power AC_PS may be applied to the opening sheet OPS through the mask frame MF. The substrate SUB is grounded, and the positive and negative voltages (+, −) are swapped and applied to the opening sheet OPS, so that an electrostatic force may be generated between the substrate SUB and the opening sheet OPS. That is, an attractive force may also be generated between the substrate SUB and the opening sheet OPS.

The opening sheet OPS may move toward the substrate SUB by an attractive force generated between the substrate SUB and the opening sheet OPS. The lowered opening sheet OPS may move upward toward the substrate SUB to be spread more flatly.

Figure 10:
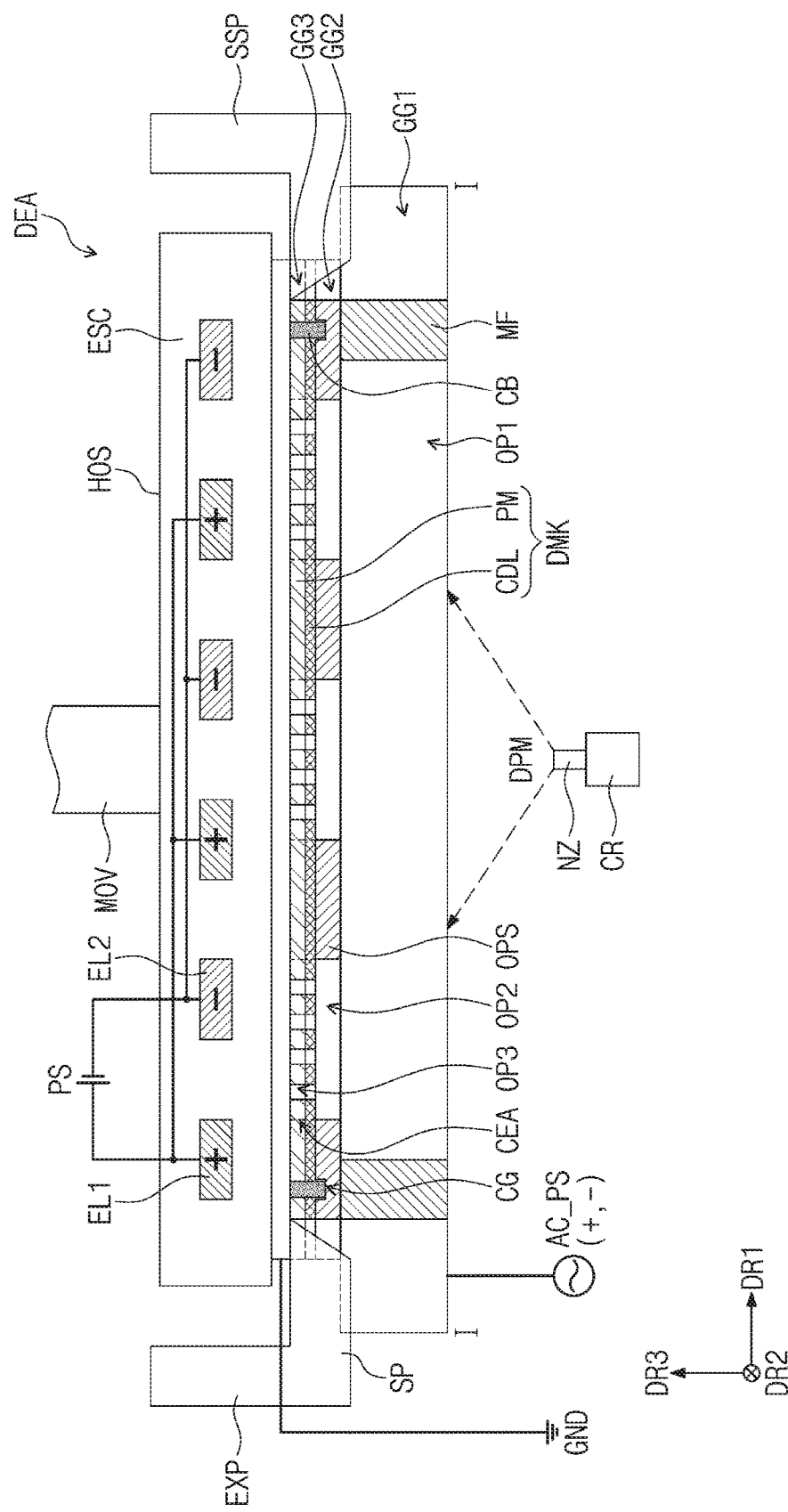
FIG. 10 is a view for explaining a deposition process performed while the deposition mask shown in FIG. 9 is seated on a substrate.

FIG. 10 is a view for explaining a deposition process performed while the deposition mask DMK shown in FIG. 9 is seated on the substrate SUB.

Referring to FIG. 10, a crucible CR may be disposed under the mask frame MF to face the deposition mask DMK. For example, one crucible CR is illustrated, but substantially a plurality of crucibles CR may be disposed under the deposition mask DMK.

A nozzle NZ may be disposed on the crucible CR. A deposition material DPM may be accommodated in the crucible CR. Although not shown in the drawing, a heat source for heating the crucible CR may be disposed in the crucible CR. Although not shown in the drawing, the crucible CR, the deposition mask DMK, the opening sheet OPS, the mask frame MF, and the electrostatic chuck ESC may be disposed in a vacuum chamber used in a manufacturing process of a display device.

The crucible CR may be heated, the deposition material DPM may be vaporized, and may be sprayed upward through the nozzle NZ. The vaporized deposition material DPM may pass through the first opening parts OP1, the second opening parts OP2, and the third opening parts OP3 to be provided to the substrate SUB. The deposition material DPM may include a material for forming a light emitting layer. The deposition material DPM is provided on the lower surface of the substrate SUB so that light emitting layers may be formed. The light emitting layer will be shown in FIG. 12 below.

Figure 11:
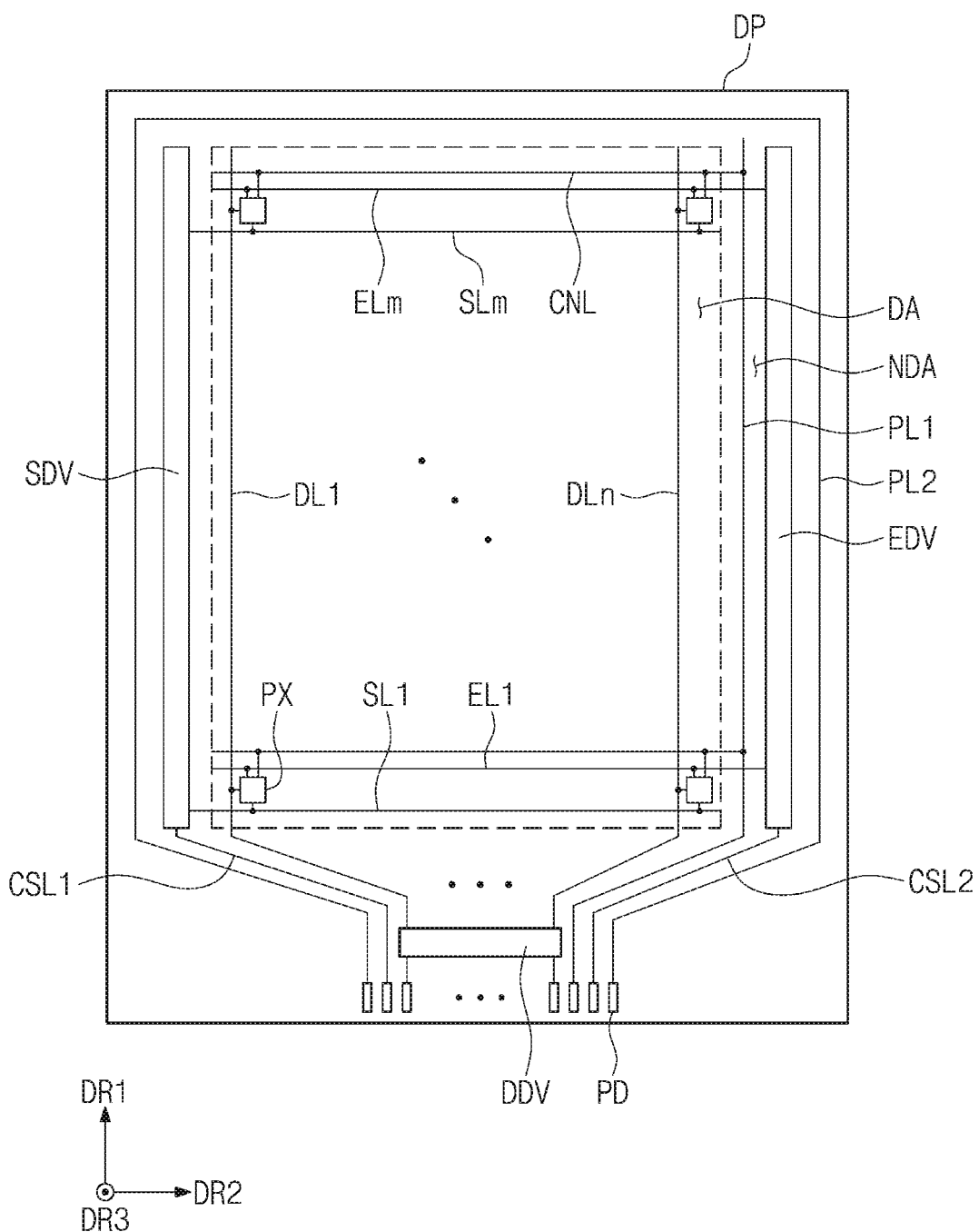
FIG. 11 is a plan view of a display panel manufactured by using the deposition apparatus illustrated in FIG. 1.

FIG. 11 is a plan view of a display panel DP manufactured by using the deposition apparatus DEA illustrated in FIG. 1.

Referring to FIG. 11, the display panel DP may have a rectangular shape having long sides extending in the first direction DR1 and short sides extending in the second direction DR2 but the shape of the display panel DP can be shapes other than a rectangular shape. The display panel DP may include a display part DA and a non-display part NDA surrounding the display part DA.

The display panel DP may be a light emitting display panel. The display panel DP may be an organic light emitting display panel or a quantum dot light emitting display panel. The light emitting layer of the organic light emitting display panel may include an organic light emitting material. The light emitting layer of the quantum dot light emitting display panel may include a quantum dot and a quantum rod. Hereinafter, the display panel DP is described as the organic light emitting display panel.

The display panel DP may include plurality of pixels PX, a plurality of scan lines SL1 to SLm, a plurality of data lines DL1 to DLn, a plurality of light emission lines EL1 to ELm, first and second control lines CSL1 and CSL2, first and second power lines PL1 and PL2, connection lines CNL, and a plurality of pads PD, where m and n are natural numbers.

The pixels PX may be disposed in the display part DA. A scan driver SDV and an emission driver EDV may be disposed in the non-display part NDA adjacent to the long sides of the display panel DP, respectively. A data driver DDV may be disposed in the non-display part NDA adjacent to one of the short sides of the display panel DP. When viewed on a plane, the data driver DDV may be adjacent to the lower end of the display panel DP.

The scan lines SL1 to SLm may extend in the second direction DR2 and may be connected to the pixels PX and the scan driver SDV. The data lines DL1 to DLn may extend in the first direction DR1 to be connected to the pixels PX and the data driver DDV. The emission lines EL1 to ELm extend in the second direction DR2 and may be connected to the pixels PX and the emission driver EDV.

The first power line PL1 may extend in the first direction DR1 and may be disposed in the non-display part NDA. The first power line PL1 may be disposed between the display part DA and the emission driver EDV. However, in an embodiment, the first power line PL1 may be disposed between the display part DA and the scan driver SDV.

The connection lines CNL may extend in the second direction DR2 and may be arranged in the first direction DR1. The connection lines CNL may be connected to the first power line PL1 and the pixels PX. A first voltage may be applied to the pixels PX through the first power line PL1 connected to each other and the connection lines CNL.

The second power line PL2 may be disposed in the non-display part NDA. The second power line PL2 may extend along long sides of the display panel DP and along the other short side of the display panel DP on which the data driver DDV is not disposed. The second power line PL2 may be disposed outside the scan driver SDV and the emission driver EDV.

Although not shown, the second power line PL2 may extend toward the display part DA to be connected to the pixels PX. A second voltage having a level lower than the first voltage may be applied to the pixels PX through the second power line PL2.

The first control line CSL1 may be connected to the scan driver SDV and may extend toward the lower end of the display panel DP when viewed on a plane. The second control line CSL2 may be connected to the emission driver EDV and may extend toward the lower end of the display panel DP when viewed on a plane. The data driver DDV may be disposed between the first control line CSL1 and the second control line CSL2.

The pads PD may be disposed on the display panel DP. The pads PD may be closer to the lower end of the display panel DP than the data driver DDV. The data driver DDV, the first power line PL1, the second power line PL2, the first control line CSL1, and the second control line CSL2 may be connected to the pads PD. The data lines DL1 to DLn may be connected to the data driver DDV, and the data driver DDV may be connected to the pads PD corresponding to the data lines DL1 to DLn.

Each of the cell areas CEA shown in FIG. 1 may correspond to the display panel DP shown in FIG. 11. Light emitting elements of one display panel DP may be formed by one cell area CEA. Light emitting elements of the plurality of display panels DP may be formed through the cell areas CEA of the deposition mask DMK.

Unit areas corresponding to the display panels DP may be defined in the above-described substrate SUB. After light emitting elements are formed in the unit areas, the unit areas may be cut. Accordingly, the display panel DP shown in FIG. 11 may be manufactured.

Although not shown in the drawing, a timing controller for controlling the operation of the scan driver SDV, the data driver DDV, and the emission driver EDV, and a voltage generation unit for generating the first and second voltages may be disposed on a printed circuit board. The timing controller and the voltage generation unit may be connected to the corresponding pads PD through the printed circuit board.

The scan driver SDV may generate a plurality of scan signals, and the scan signals may be applied to the pixels PX through the scan lines SL1 to SLm. The data driver DDV may generate a plurality of data voltages, and the data voltages may be applied to the pixels PX through the data lines DL1 to DLn. The emission driver EDV may generate a plurality of emission signals, and the emission signals may be applied to the pixels PX through the emission lines EL1 to ELm.

The pixels PX may be provided with the data voltages in response to the scan signals. The pixels PX may display an image by emitting light having luminance corresponding to data voltages in response to emission signals. The emission time of the pixels PX may be controlled by emission signals.

The above-described wires may include data lines DL1 to DLn. Pads connected to the above-mentioned wires may include the pads PD shown in FIG. 11. The display panel DP on which the light emitting layers of the pixels PX are not formed may be defined as the above-described substrate SUB.

The cross-sectional structure of the substrate SUB on which light emitting layers are not formed will be described below with reference to FIGS. 13A and 13B. Pads PD are formed on the substrate SUB, and the substrate SUB may be defined in a state in which the printed circuit board is not connected. The pads PD are connected to the ground terminal GND, so that the pads PD and the data lines DL1 to DLn may be grounded.

Figure 12:
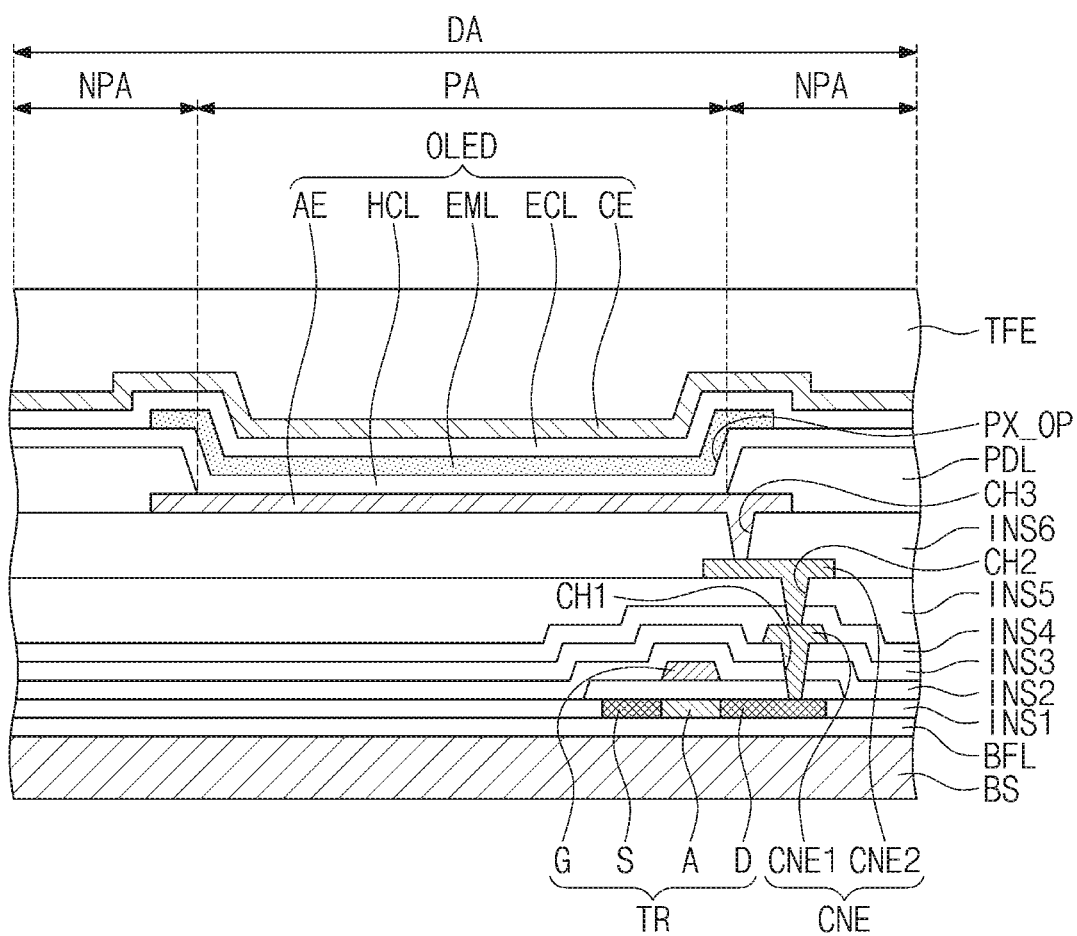
FIG. 12 is a diagram illustrating a cross section of one pixel illustrated in FIG. 11 by way of example.

FIG. 12 is a diagram illustrating a cross section of one pixel illustrated in FIG. 11 by way of example.

Referring to FIG. 12, the pixel PX is disposed on a base substrate BS, and may include a transistor TR and a light emitting element OLED. The transistors TR and the light emitting elements OLED of the pixels PX may be connected to the above-mentioned data lines DL1 to DLm and the first and second power lines PL1 and PL2.

The transistors TR and the light emitting elements OLED of the pixels PX may be connected to the above-mentioned pads PD through the data lines DL1 to DLm and the first and second power lines PL1 and PL2. The transistors TR of the pixels PX may be connected to the pads PD through the data lines DL1 to DLm.

The light emitting element OLED may include a first electrode AE, a second electrode CE, a hole control layer HCL, an electronic control layer ECL, and an emission layer EML. The first electrode AE may be an anode electrode, and the second electrode CE may be a cathode electrode.

The transistor TR and the light emitting element OLED may be disposed on the base substrate BS. For example, one transistor TR is illustrated, but substantially, the pixel PX may include a plurality of transistors and at least one capacitor for driving the light emitting element OLED.

The display part DA may include a light emitting part PA corresponding to the pixel PX and a non-light emitting part NPA around the light emitting part PA. The light emitting element OLED may be disposed on the light emitting part PA.

The base substrate BS may include a flexible plastic substrate. For example, the base substrate BS may include transparent polyimide (PI). A buffer layer BFL is disposed on the base substrate BS, and the buffer layer BFL may be an inorganic layer.

A semiconductor pattern may be disposed on the buffer layer BFL. The semiconductor pattern may include polysilicon. However, in an embodiment, the semiconductor pattern may include amorphous silicon or metal oxide.

The semiconductor pattern may be doped with an N-type dopant or a P-type dopant. The semiconductor pattern may include a high doping area and a low doping area. The conductivity of the high doping area is greater than that of the low doping area, and may substantially serve as a source electrode and a drain electrode of the transistor TR. The low doping area may substantially correspond to the active region or channel of the transistor.

A source S, active region A, and drain D of the transistor TR may be formed from a semiconductor pattern. A first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

A connection electrode CNE is disposed between the transistor TR and the light emitting element OLED to connect the transistor TR and the light emitting element OLED. The connection electrode CNE may include a first connection electrode CNE1 and a second connection electrode CNE2.

The first connection electrode CNE1 may be disposed on the third insulating layer INS3, and may be connected to the drain D through a first contact hole CH1 defined in the first to third insulating layers INS1 to INS3. A fourth insulating layer INS4 may be disposed on the first connection electrode CNE1. A fifth insulating layer INS5 may be disposed on the fourth insulating layer INS4.

The second connection electrode CNE2 may be disposed on the fifth insulating layer INS5. The second connection electrode CNE2 may be connected to the first connection electrode CNE1 through a second contact hole CH2 defined in the fifth insulating layer INS5. A sixth insulating layer INS6 may be disposed on the second connection electrode CNE2. The first to sixth insulating layers INS1 to INS6 may be inorganic or organic layers.

The first electrode AE may be disposed on the sixth insulating layer INS6. The first electrode AE may be connected to the second connection electrode CNE2 through a third contact hole CH3 defined in the sixth insulating layer INS6. A pixel defining film PDL exposing a predetermined portion of the first electrode AE may be disposed on the first electrode AE and the sixth insulating layer INS6. An opening part PX_OP for exposing a predetermined portion of the first electrode AE may be defined in the pixel defining film PDL.

The hole control layer HCL may be disposed on the first electrode AE and the pixel defining film PDL. The hole control layer HCL may be commonly disposed in the light emitting part PA and the non-light emitting part NPA. The hole control layer HCL may include a hole transport layer and a hole injection layer.

The light emitting layer EML may be disposed on the hole control layer HCL. The light emitting layer EML may be disposed in an area corresponding to the opening part PX_OP. The light emitting layer EML may include an organic material and/or an inorganic material. The light emitting layer EML may generate any one of red, green, and blue light.

The electronic control layer ECL may be disposed on the light emitting layer EML and the hole control layer HCL. The electron control layer ECL may be commonly disposed in the light emitting part PA and the non-light emitting part NPA. The electron control layer ECL may include an electron transport layer and an electron injection layer.

The second electrode CE may be disposed on the electronic control layer ECL. The second electrode CE may be commonly disposed on the pixels PX. A layer from the buffer layer BFL to the light emitting element OLED may be defined as a pixel layer.

The thin film sealing layer TFE may be disposed on the light emitting element OLED. The thin film sealing layer TFE may be disposed on the second electrode CE to cover the pixel PX. The thin film sealing layer TFE may include at least two inorganic layers and an organic layer disposed between the inorganic layers. The inorganic layer may protect the pixel PX from moisture/oxygen. The organic layer may protect the pixel PX from foreign substances such as dust particles.

A first voltage may be applied to the first electrode AE through the transistor TR, and a second voltage having a level lower than the first voltage may be applied to the second electrode CE. The holes and electrons injected into the light emitting layer EML are combined to form excitons, and as the excitons transition to the ground state, the light emitting element OLED may emit light.

Figure 13A:
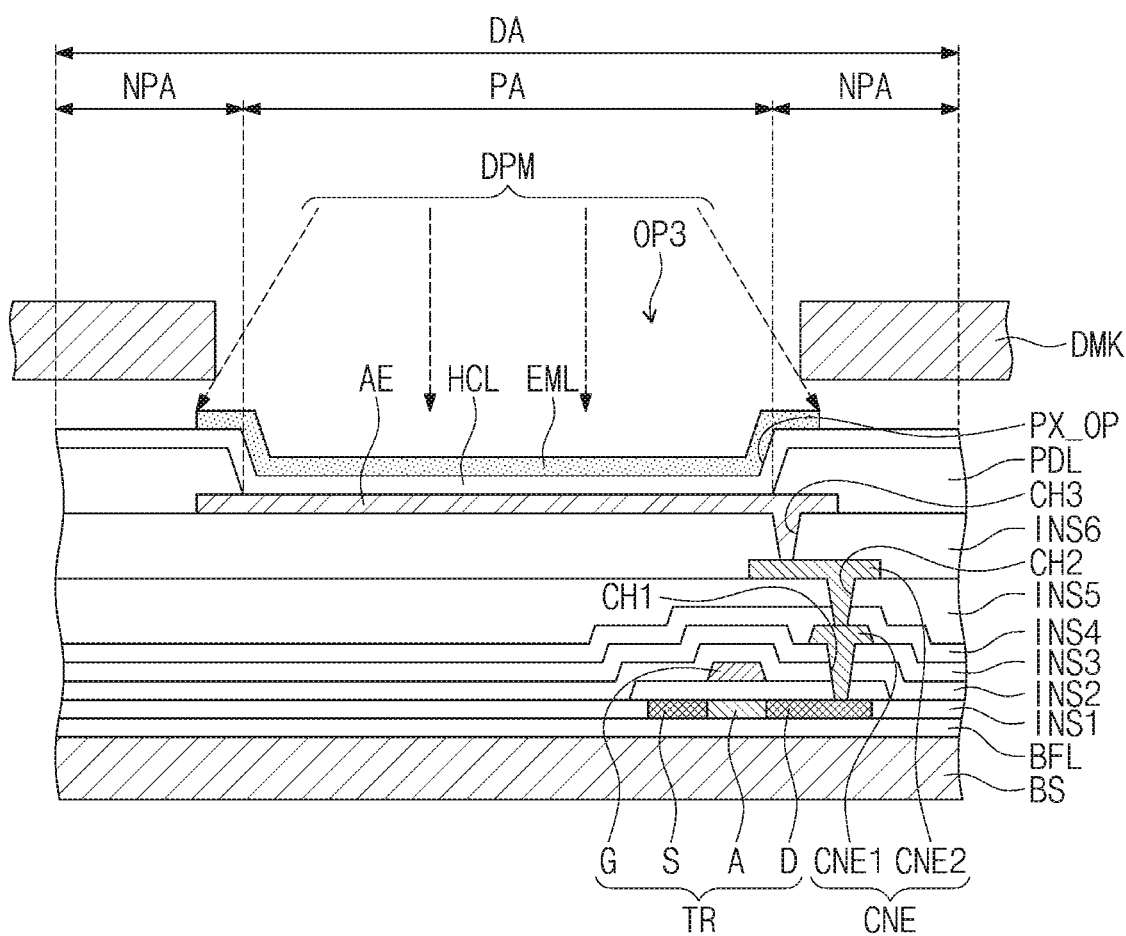
FIG. 13A is a diagram for explaining a deposition process shown in FIG. 10.

FIG. 13A is a diagram for explaining a deposition process shown in FIG. 10. FIG. 13B is a diagram for explaining a deposition process performed in a state in which a deposition mask is not seated on a substrate.

Figure 13B:
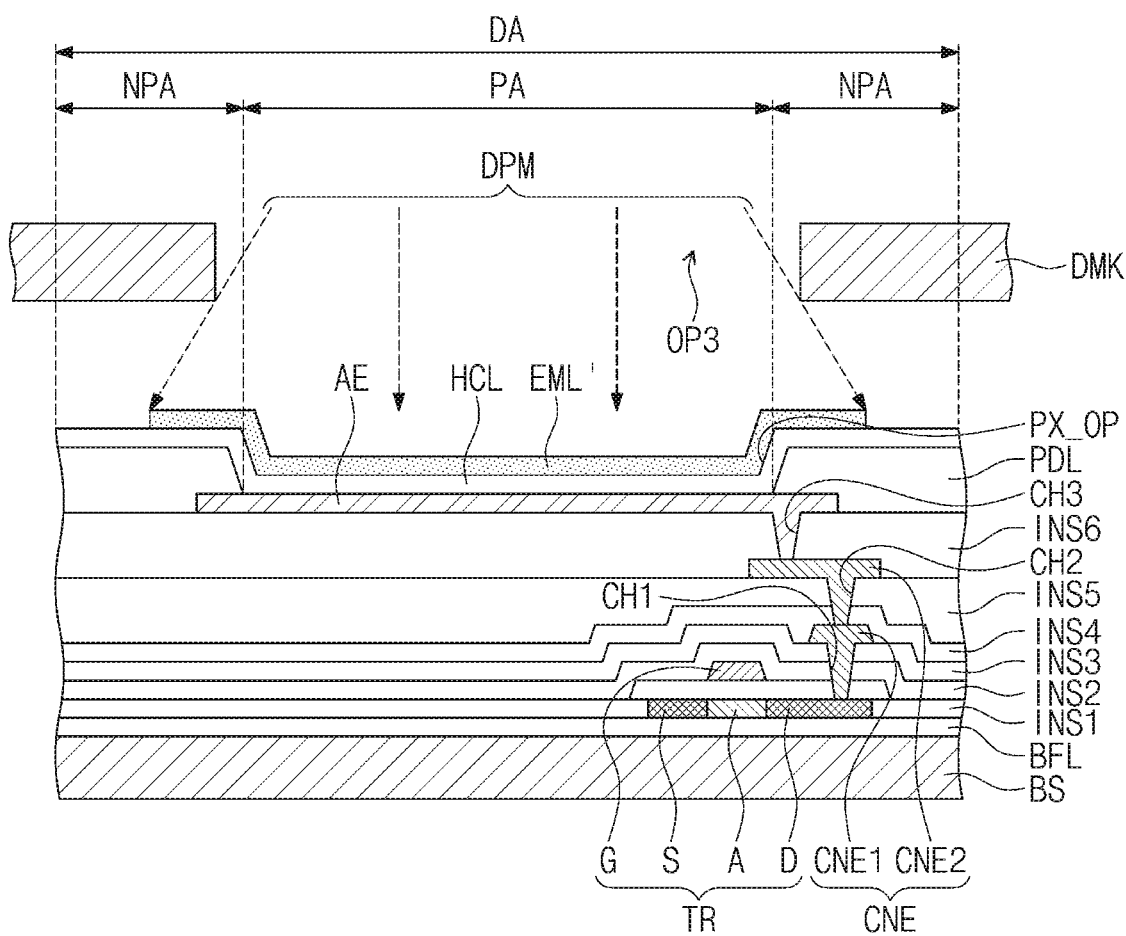
FIG. 13B is a diagram for explaining a deposition process performed in a state in which a deposition mask is not seated on a substrate.

For example, FIGS. 13A and 13B are cross-sectional views corresponding to FIG. 12, and any one third opening part OP3 is illustrated in FIGS. 13A and 13B. For convenience of explanation, the substrate SUB and the deposition mask DMK shown in FIG. 10 are shown in reverse up and down in FIGS. 13A and 13B.

Referring to FIG. 13A, the substrate SUB is defined from the base substrate BS to the layer on which the first electrode AE is disposed. As described above, the transistor TR may be connected to the pads PD through the data lines DL1 to DLm. That is, the substrate SUB may include data lines DL1 to DLm defined by the above-described wires and pads PD connected to the data lines DL1 to DLm.

A deposition mask DMK may be disposed to face the substrate SUB. The deposition mask DMK may be disposed close to the substrate SUB. The position of the deposition mask DMK illustrated in FIG. 13A may substantially correspond to the position of the deposition mask DMK illustrated in FIG. 9.

The deposition material DPM may be provided on the substrate SUB through the third opening part OP3 defined in the deposition mask DMK. A light emitting layer EML may be formed on the substrate SUB by the deposition material DPM.

Referring to FIG. 13B, the deposition mask DMK may not be disposed close to the substrate SUB. For example, the deposition mask DMK shown in FIG. 13B may be spaced apart from the substrate SUB more than the position of the deposition mask DMK shown in FIG. 13A. The position of the deposition mask DMK may correspond to the position of the deposition mask DMK shown in FIG. 8.

The deposition material DPM may be sprayed from the nozzle NOZ with a predetermined spraying angle. Since the deposition material DPM is sprayed with a predetermined spraying angle, as the deposition mask DMK is spaced apart from the substrate SUB, the deposition material DPM may be deposited on an undesired area. That is, the light emitting layer EML' may not be normally formed.

Referring to FIG. 13A, in an embodiment of the inventive concept, since the deposition mask DMK is disposed close to the substrate SUB, even if the deposition material DPM is sprayed with a predetermined spraying angle, a normal light emitting layer EML may be formed.

Figure 14:
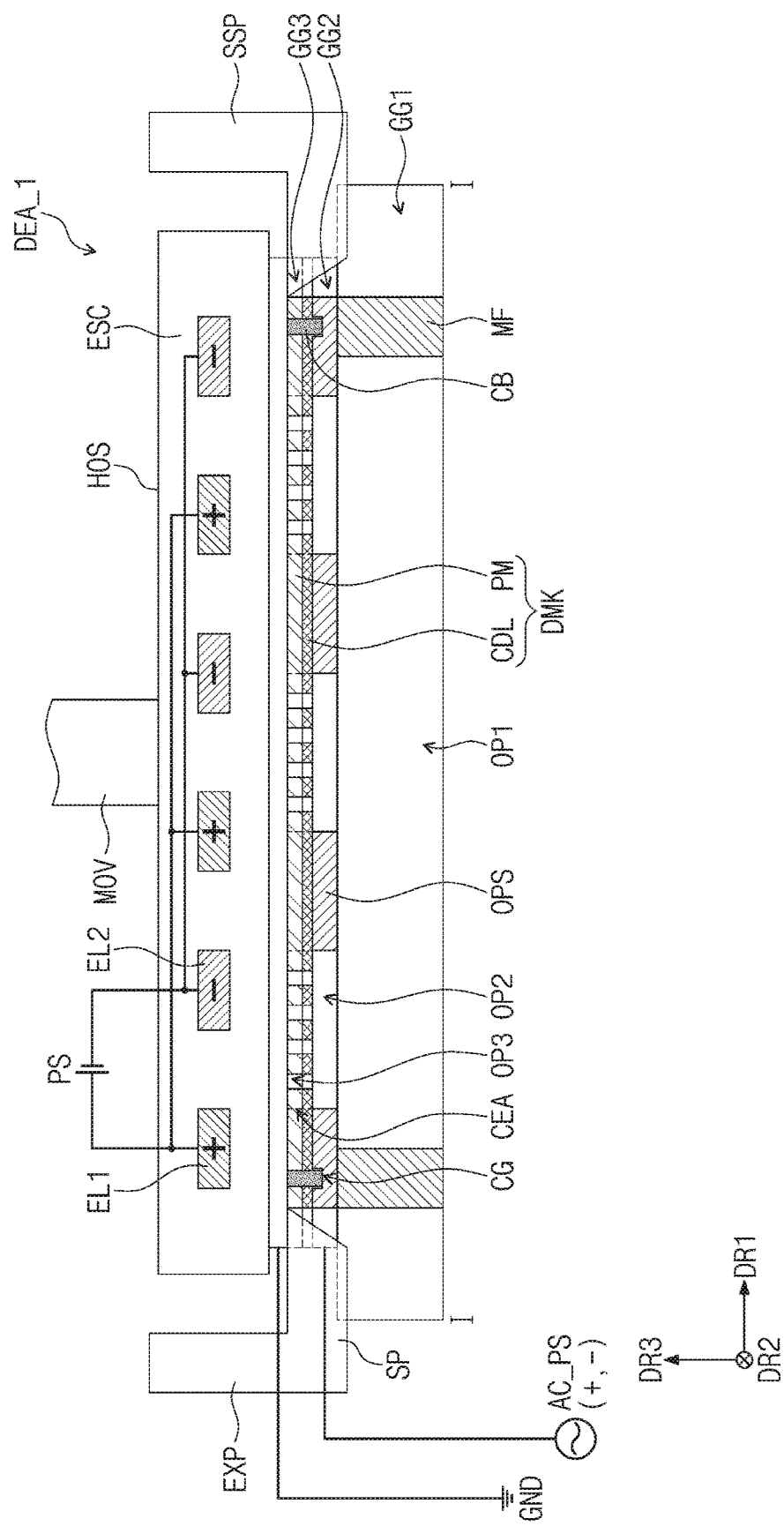
FIGS. 14, 15, and 16 are views illustrating deposition apparatuses according to an embodiment of the inventive concept.
Figure 15:
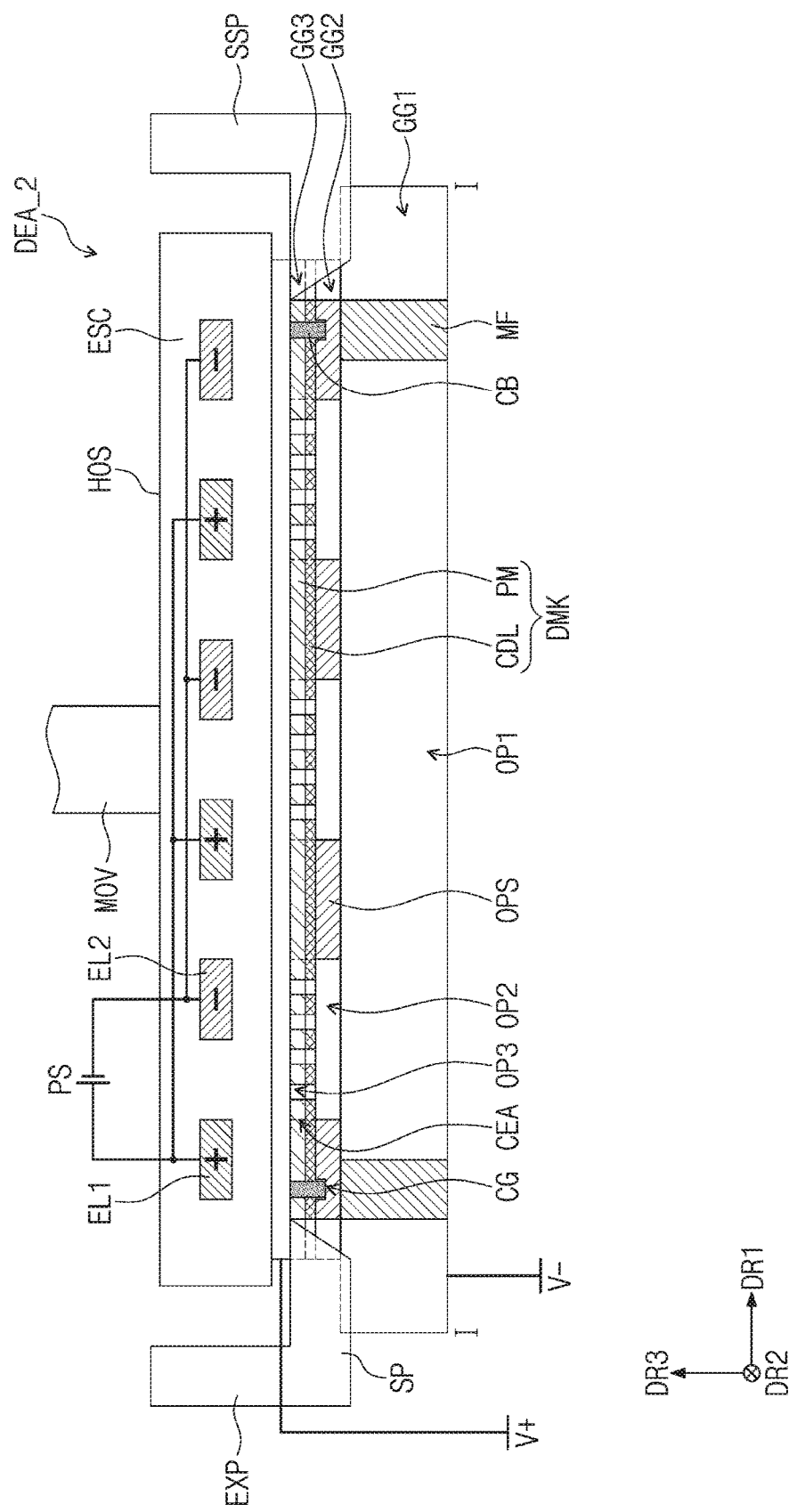
Figure 16:
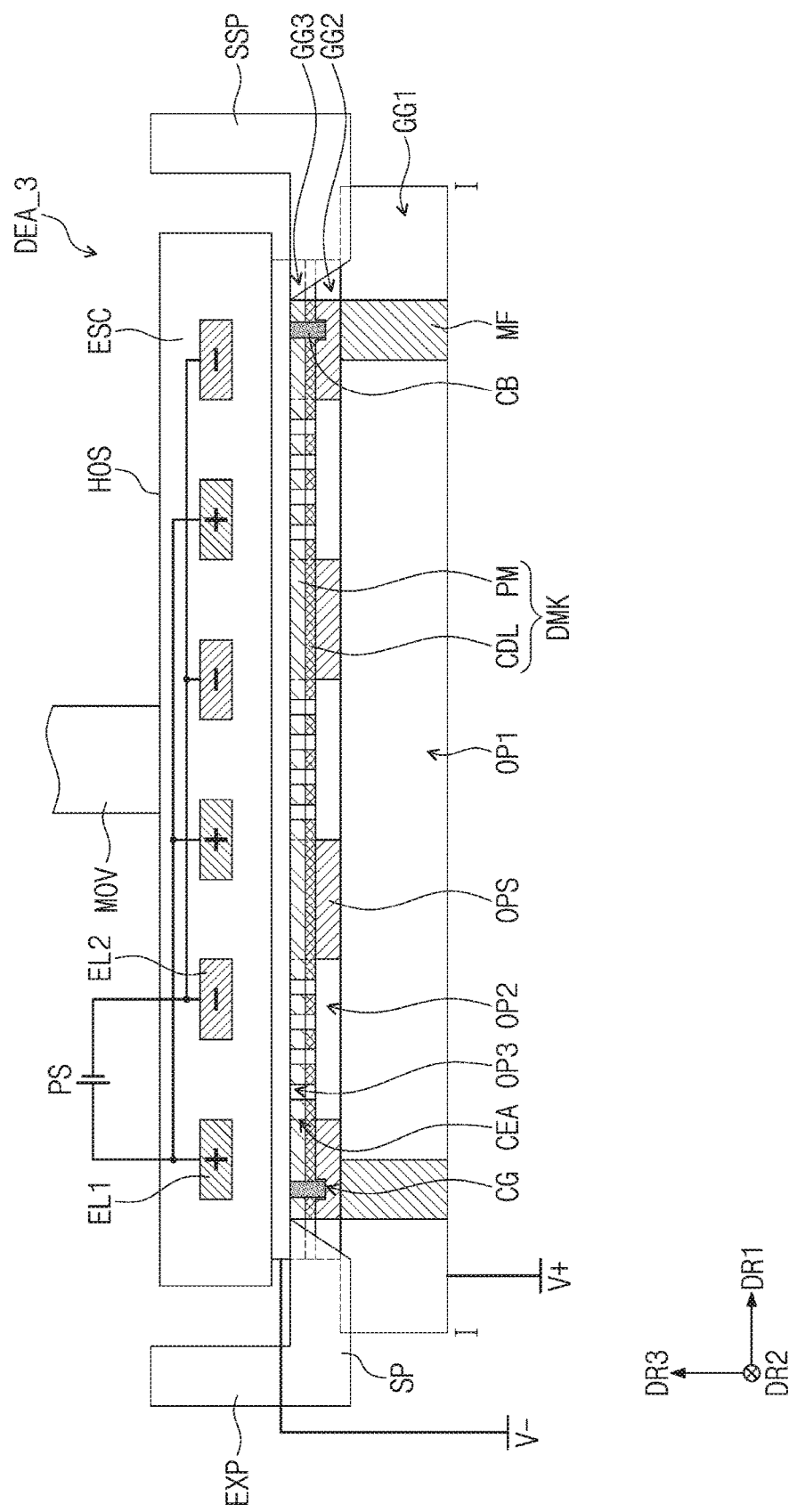

FIGS. 14, 15, and 16 are views illustrating deposition apparatuses according to an embodiment of the inventive concept.

Exemplarily, FIGS. 14 to 16 are illustrated in cross-sections corresponding to FIG. 9. Hereinafter, mainly based on a configuration different from that of the deposition apparatus DEA, configurations of the deposition apparatuses DEA_1, DEA_2, and DEA_3 illustrated in FIGS. 14 to 16 will be described. Substantially, other configurations may be the same as that of the deposition apparatus DEA except for the power application method.

Referring to FIG. 14, the AC power AC_PS in the deposition apparatus DEA_1 may be applied to an opening sheet OPS. The AC power AC_PS may be applied to the conductive layer CDL of the deposition mask DMK through the opening sheet OPS. The substrate SUB may be grounded. Accordingly, constant power may be generated between the conductive layer CDL to which the AC power AC_PS is applied and the substrate SUB.

Referring to FIGS. 15 and 16, a voltage may be applied to the substrate SUB and the deposition mask DMK. For example, voltages of different polarities may be applied to the substrate SUB and the conductive layer CDL of the deposition mask DMK. Accordingly, the substrate SUB and the conductive layer CDL may be charged with different polarities.

Referring to FIG. 15, in the deposition apparatus DEA_2, the substrate SUB may be applied with a positive polarity voltage V+, and the conductive layer CDL may be applied with a negative polarity voltage V−. The positive voltage V+ may be applied to the pads PD of the substrate SUB described above.

The negative voltage V− may be applied to the conductive layer CDL through the mask frame MF and the opening sheet OPS. Accordingly, an attractive force is generated between the substrate SUB and the deposition mask DMK, so that the deposition mask DMK may be seated on the substrate SUB.

Referring to FIG. 16, in the deposition apparatus DEA_3, the substrate SUB may be applied with a negative polarity voltage V−, and the conductive layer CDL may be applied with a positive polarity voltage V+. The negative voltage V− may be applied to the pads PD of the substrate SUB described above.

The positive voltage V+ may be applied to the conductive layer CDL through the mask frame MF and the opening sheet OPS. Accordingly, an attractive force is generated between the substrate SUB and the deposition mask DMK, so that the deposition mask DMK may be seated on the substrate SUB.

According to an embodiment of the inventive concept, as the substrate is grounded and AC power in which the positive and negative voltages are repeatedly swapped is applied to the deposition mask, the deposition mask may be more easily seated on the substrate. As a result, the interval between the substrate and the deposition mask may be minimized.

Although embodiments of the inventive concept have been described, it is understood that the inventive concept should not be limited to these embodiments but various changes and modifications may be made by one ordinary skilled in the art within the spirit and scope of the inventive concept as hereinafter claimed.

What is claimed is:

1. A deposition apparatus comprising:
a mask frame in which a first opening part is defined;
an opening sheet disposed on the mask frame and in which a second opening part overlapping the first opening part is defined;
a deposition mask disposed on the opening sheet and in which a plurality of third opening parts overlapping the second opening part are defined;
an electrostatic chuck disposed on the deposition mask and on which a substrate is disposed;
a substrate support part supporting an edge of the substrate; and
a connection bar disposed on the deposition mask,
wherein the substrate is disposed on a surface of the electrostatic chuck,
wherein AC power is applied to the deposition mask,
wherein the deposition mask comprises:
a polymer mask in which the plurality of third opening parts are defined; and
a conductive layer disposed on a surface of the polymer mask and in which the plurality of third opening parts are defined,
wherein when viewed on a plane, the polymer mask and the conductive layer have the same shape and entirely overlap each other,
wherein the AC power is applied to the conductive layer,
wherein the connection bar is disposed adjacent to an edge of the deposition mask,
wherein a connection groove overlapping the connection bar is defined on an upper surface of the opening sheet adjacent to an edge of the opening sheet,
wherein the connection bar penetrates the polymer mask and the conductive layer and ends at a portion of the upper surface of the opening sheet where the connection groove is defined, and the connection bar does not extend through the opening sheet,
wherein a first guide groove is defined at an edge of the mask frame, and the first guide groove overlaps the substrate support part when viewed on the plane and extends through the mask frame in the thickness direction,
wherein a second guide groove is defined at an edge of the opening sheet, and the second guide groove overlaps the first guide groove when viewed on the plane and extends through the opening sheet in the thickness direction,
wherein a third guide groove is defined at an edge of the deposition mask, and the third guide groove overlaps the second guide groove when viewed on the plane and extends through the deposition mask in the thickness direction,
wherein when the substrate support part is moved up and down, the substrate support part moves along the first, second, and third guide grooves,
wherein when a deposition process is performed, the substrate support part is disposed within the first, second, and third guide grooves,
wherein the connection groove of the opening sheet is a recessed portion extending from the upper surface of the opening sheet in a direction toward the mask frame, and a portion of the conductive layer of the deposition mask includes a grooved portion disposed inside the recessed portion of the opening sheet.

2. The deposition apparatus of claim 1, wherein the substrate is grounded.

3. The deposition apparatus of claim 2, wherein the substrate comprises:
a plurality of wires; and
a plurality of pads connected to the wires,
wherein each of the plurality of pads connected to the wires is grounded.

4. The deposition apparatus of claim 1, wherein the polymer mask comprises a polymer film.

5. The deposition apparatus of claim 1, wherein the deposition mask is disposed close to the substrate by an electrostatic force between the conductive layer and the substrate.

6. The deposition apparatus of claim 1, wherein the mask frame, the opening sheet, and the deposition mask are in contact with each other.

7. The deposition apparatus of claim 6, wherein the AC power is connected to the mask frame.

8. The deposition apparatus of claim 6, wherein the AC power is connected to the opening sheet.

9. The deposition apparatus of claim 1, wherein the electrostatic chuck comprises:
a first electrode having a first polarity; and
a second electrode having a second polarity opposite to the first polarity,
wherein the substrate is in contact with the surface of the electrostatic chuck by an electrostatic force generated by the first and second electrodes.

10. The deposition apparatus of claim 1, wherein the deposition mask is connected to the opening sheet through the connection bar.

11. The deposition apparatus of claim 1, wherein the connection bar is disposed at a height equal to or lower than a surface of the deposition mask.

12. A deposition apparatus comprising:
a mask frame in which a first opening part is defined;
an opening sheet disposed on the mask frame and in which a second opening part overlapping the first opening part is defined;
a deposition mask disposed on the opening sheet and in which a plurality of third opening parts overlapping the second opening part are defined;
an electrostatic chuck disposed on the deposition mask and on which a substrate is disposed;
a substrate support part supporting an edge of the substrate; and
a connection bar disposed on the deposition mask,
wherein the substrate is disposed on a surface of the electrostatic chuck,
wherein the deposition mask comprises:
a polymer mask in which the plurality of third opening parts are defined; and a conductive layer disposed on a surface of the polymer mask and in which the plurality of third opening parts are defined, wherein the substrate and the conductive layer are charged with different polarities, wherein when viewed on a plane, the polymer mask and the conductive layer have the same shape and entirely overlap each other, wherein AC power is applied to the conductive layer, wherein the connection bar is disposed adjacent to an edge of the deposition mask, wherein a connection groove overlapping the connection bar is defined on an upper surface of the opening sheet adjacent to an edge of the opening sheet, wherein the connection bar penetrates the polymer mask and the conductive layer and ends at a portion of the upper surface of the opening sheet where the connection groove is defined, and the connection bar does not extend through the opening sheet, wherein a first guide groove is defined at an edge of the mask frame, and the first guide groove overlaps the substrate support part when viewed on the plane and extends through the mask frame in the thickness direction, wherein a second guide groove is defined at an edge of the opening sheet, and the second guide groove overlaps the first guide groove when viewed on the plane and extends through the opening sheet in the thickness direction, wherein a third guide groove is defined at an edge of the deposition mask, and the third guide groove overlaps the second guide groove when viewed on the plane and extends through the deposition mask in the thickness direction, wherein when the substrate support part is moved up and down, the substrate support part moves along the first, second, and third guide grooves, wherein when a deposition process is performed, the substrate support part is disposed within the first, second, and third guide grooves, wherein the connection groove of the opening sheet is a recessed portion extending from the upper surface of the opening sheet in a direction toward the mask frame, and a portion of the conductive layer of the deposition mask includes a grooved portion disposed inside the recessed portion of the opening sheet.

* * * * *